(12) United States Patent
Polomoff et al.

(10) Patent No.: US 11,855,005 B2
(45) Date of Patent: Dec. 26, 2023

(54) CRACKSTOP WITH EMBEDDED PASSIVE RADIO FREQUENCY NOISE SUPPRESSOR AND METHOD

(71) Applicant: GLOBALFOUNDRIES U.S. Inc., Malta, NY (US)

(72) Inventors: Nicholas A. Polomoff, Hopewell Junction, NY (US); Frank G. Kuechenmeister, Dresden (DE); Richard F. Taylor, III, Campbell, CA (US); Saquib B. Halim, Gmund am Tegernsee (DE)

(73) Assignee: GlobalFoundries U.S. Inc., Malta, NY (US)

( * ) Notice: Subject to any disclaimer, the term of this patent is extended or adjusted under 35 U.S.C. 154(b) by 51 days.

(21) Appl. No.: 17/352,414

(22) Filed: Jun. 21, 2021

(65) Prior Publication Data
US 2022/0406732 A1 Dec. 22, 2022

(51) Int. Cl.
| | |
|---|---|
| *G06F 30/392* | (2020.01) |
| *H01L 23/66* | (2006.01) |
| *H03H 1/00* | (2006.01) |
| *H01L 23/58* | (2006.01) |
| *H01L 23/00* | (2006.01) |

(52) U.S. Cl.
CPC .......... *H01L 23/562* (2013.01); *G06F 30/392* (2020.01); *H01L 23/564* (2013.01); *H01L 23/585* (2013.01); *H01L 23/66* (2013.01); *H03H 1/0007* (2013.01)

(58) Field of Classification Search
None
See application file for complete search history.

(56) References Cited

U.S. PATENT DOCUMENTS

| | | | |
|---|---|---|---|
| 6,492,716 B1 | 12/2002 | Bothra et al. | |
| 6,537,849 B1* | 3/2003 | Tsai | H01L 23/552 257/E23.114 |

(Continued)

OTHER PUBLICATIONS

Mchenry et al., "Electronic Noise Is Drowning Out the Internet of Things", IEEE Spectrum, 2015, pp. 1-5.

(Continued)

*Primary Examiner* — Bo B Jang
(74) *Attorney, Agent, or Firm* — Anthony Canale; Hoffman Warnick LLC

(57) ABSTRACT

Disclosed is a radio frequency integrated circuit (RFIC) chip that includes an integrated circuit (IC) area and a crackstop laterally surrounding the IC area. The crackstop includes a metallic barrier (or, alternatively, concentric metallic barriers) electrically isolated from the IC area. One or more noise suppressors and, particularly, one or more passive filters (e.g., low pass filter(s), high pass filter(s), band pass filter(s), and/or band stop filter(s)) are integrated into the structure of the metallic barrier(s) to inhibit propagation, through the crackstop, of noise signals within a specific RF range. The specific RF range can be a customer-specified operating parameter. By embedding customized noise suppressor(s) into the crackstop, local signal interference unique to the customer-specified operating parameters can be minimized while also avoiding or at least minimizing the risk of moisture ingress to the IC area. Also disclosed is a method of forming the chip.

9 Claims, 34 Drawing Sheets

(56) References Cited

U.S. PATENT DOCUMENTS

| | | | |
|---|---|---|---|
| 6,943,063 B2* | 9/2005 | Tsai | H01L 23/552 |
| | | | 257/E23.114 |
| 7,776,671 B2 | 8/2010 | Kim | |
| 7,795,615 B2 | 9/2010 | Goebel et al. | |
| 7,812,424 B2 | 10/2010 | Barth et al. | |
| 7,820,520 B2 | 10/2010 | Demircan et al. | |
| 7,893,459 B2 | 2/2011 | Wang et al. | |
| 7,898,056 B1* | 3/2011 | Keramat | H01L 23/585 |
| | | | 257/E29.007 |
| 8,729,664 B2 | 5/2014 | Gambino et al. | |
| 8,803,290 B2 | 8/2014 | Frederick, Jr. et al. | |
| 8,933,567 B2 | 1/2015 | Bang et al. | |
| 9,012,297 B2 | 4/2015 | Barth et al. | |
| 9,559,063 B2 | 1/2017 | Watanabe et al. | |
| 9,786,733 B2 | 10/2017 | Barth et al. | |
| 10,062,748 B1 | 8/2018 | Stamper et al. | |
| 10,109,600 B1 | 10/2018 | McGahay et al. | |
| 10,522,499 B2 | 12/2019 | Enquist et al. | |
| 10,546,822 B2 | 1/2020 | Polomoff et al. | |
| 10,879,210 B2 | 12/2020 | Enquist et al. | |
| 2004/0129938 A1 | 7/2004 | Landers et al. | |
| 2007/0102787 A1* | 5/2007 | Goebel | H01L 23/5223 |
| | | | 257/532 |
| 2009/0160020 A1* | 6/2009 | Barth | G06F 30/39 |
| | | | 257/532 |
| 2010/0084751 A1* | 4/2010 | Frederick, Jr. | H01L 23/585 |
| | | | 257/E23.18 |
| 2014/0246752 A1 | 9/2014 | Barry et al. | |
| 2015/0303888 A1 | 10/2015 | Yen et al. | |
| 2020/0203156 A1 | 6/2020 | Fan et al. | |
| 2020/0381355 A1 | 12/2020 | Polomoff et al. | |

OTHER PUBLICATIONS

Geier, Eric, "How to Fix Wi-Fi Interference", Network World, 2021, pp. 1-8.
Blalack, Tallis, "On-Chip RF-Isolation Techniques", EE Times Design Lines, Wireless and Networking Designline, 2003, pp. 1-10.
Gambino et al., "Reliability of Segmented Edge Seal Ring for RF Devices", IEEE, 2014, pp. 367-370.

* cited by examiner

LOW PASS FILTERS

HIGH PASS FILTERS

BAND PASS FILTERS

BAND STOP FILTERS

CRACKSTOP WITH EMBEDDED PASSIVE RADIO FREQUENCY NOISE SUPPRESSOR AND METHOD

BACKGROUND

Field of the Invention

The present invention relates to crackstops and, particularly, to embodiments of a radio frequency integrated circuit (RFIC) chip with a crackstop having one or more embedded noise suppressors and embodiments of a method of forming such an RFIC chip.

Description of Related Art

Integrated circuit (IC) chip manufacturing includes the fabrication, on a semiconductor wafer, of multiple integrated circuits (ICs) having the same design and of crackstops (also referred to as seal rings) laterally surrounding the ICs. The wafer is then diced (i.e., cut up) into individual chips. The individual IC chips are subsequently packaged or mounted directly onto a laminate or a printed circuit boards (PCB). Conventionally, a crackstop is a metallic barrier (also referred to as a metallic wall) that includes stacked vias bars and wires. This metallic barrier inhibits IC damage (e.g., cracks, etc.) during wafer dicing and chip packaging/mounting and also inhibits moisture ingress to the IC. Unfortunately, on radio frequency (RF) IC chips including, on mmWave IC chips, the metallic barrier can propagate RF noise signals.

SUMMARY

In view of the foregoing, disclosed herein are embodiments of a chip and, particularly, a radio frequency integrated circuit (RFIC) chip with a crackstop having one or more embedded noise suppressors (also referred to herein as noise dampeners). Specifically, the RFIC chip can include an integrated circuit (IC) area and a crackstop laterally surrounding the IC area. The crackstop can include a metallic barrier (or, alternatively, concentric metallic barriers) physically separated from the IC area. One or more noise suppressors and, particularly, one or more passive filters (e.g., low pass filter(s), high pass filter(s), band pass filter(s), and/or band stop filter(s)) can be integrated into and, if applicable, between the structure of the metallic barrier(s) in order to inhibit propagation, through the crackstop, of noise signals within a specific RF range. The specific RF range can be, for example, a customer-specified operating parameter. By embedding customized noise suppressor(s) into the crackstop, local signal interference unique to the customer-specified operating parameters can be minimized while also avoiding or at least minimizing the risk of moisture ingress to the IC area. Also disclosed herein are embodiments of a method of forming such an RFIC chip.

More particularly, disclosed herein are embodiments of a radio frequency integrated circuit (RFIC) chip with a crackstop having one or more embedded noise suppressors (also referred to herein as noise dampeners). Each of the embodiments of the RFIC chip can include a substrate, an integrated circuit (IC) area on a center portion of the substrate, and a crackstop on an edge portion of the substrate. In some embodiments of the RFIC chip, the crackstop can include a single metallic barrier that laterally surrounds and is physically separated from the IC area. Furthermore, the metallic barrier can include at least one integrated passive filter (e.g., low pass filter(s), high pass filter(s), band pass filter(s) and/or band stop filter(s)) that includes at least one electromagnetic device (e.g., a resistor, an inductor, a capacitor, and/or a stub). In these embodiments of the RFIC chip, the electromagnetic device(s) can be embedded in the metallic barrier. In other embodiments of the RFIC chip, the crackstop can include multiple metallic barriers. These metallic barriers can include a first metallic barrier that laterally surrounds and is physically separated from the IC area and a second metallic barrier that laterally surrounds the first metallic barrier. The metallic barriers can further include at least one integrated passive filter (e.g., low pass filter(s), high pass filter(s), band pass filter(s) and/or band stop filter(s)) that includes at least one electromagnetic device (e.g., a resistor, an inductor, a capacitor, and/or a stub). In these embodiments of the RFIC chip, the electromagnetic device(s) can be embedded in the first metallic barrier, embedded in the second metallic barrier, embedded in a combination of the first metallic barrier and the second metallic barrier, and/or embedded in the space between and electrically connected to the first metallic barrier and the second metallic barrier.

In each of the disclosed embodiments of the RFIC chip, IC area can include multiple devices including RF devices and, optionally, other types of devices. These devices can at least include a first device at a first location in the IC area and a second device at a second location in the IC area. The first device can be an RF device configured to operate within a specific RF range. The second device can be another RF device or some other type of device. In any case, each passive filter can be configured to inhibit RF noise signal propagation within the specific RF range. Thus, when an RF signal in the specific RF range is emitted by the first device (e.g., by an aggressor device) and couples with the adjacent metallic barrier of the crackstop, the passive filter inhibits transmission of the RF signal noise through the crackstop (i.e., through the metallic barrier(s)) to the second device (e.g., to the victim device) in order to prevent interference with operation of the second device.

Also disclosed herein are embodiments of a method of designing and manufacturing a radio frequency integrated circuit (RFIC) chip with a crackstop having one or more embedded noise suppressors (also referred to herein as noise dampeners). More specifically, the method embodiments can include accessing a design for an RFIC chip. This RFIC chip design can include a substrate with a center portion and an edge portion that laterally surrounds the center portion and an integrated circuit (IC) area on the center portion. The RFIC design can include multiple devices, including RF devices and, optionally, other types of devices, in the IC area. These devices can at least include a first device at a first location in the IC area and a second device at a second location in the IC area. The first device can be an RF device and the second device can be another RF device or some other type of device.

The method embodiments can further include establishing the specific radio frequency (RF) range for operation of the RFIC chip and, thereby for operation of the first device. The design for the RFIC chip can then be updated to include a crackstop with at least one metallic barrier. The metallic barrier(s) can be on the edge portion of the substrate laterally surrounding and physically separated from the IC area. Additionally, the metallic barrier(s) can include at least one integrated passive filter integrated (e.g., low pass filter(s), high pass filter(s), band pass filter(s) and/or band stop filter(s)) that includes at least one electromagnetic device (e.g., a resistor, an inductor, a capacitor, and/or a stub). Each passive filter can be configured to inhibit RF noise signal propagation within the specific RF range. The RFIC chip can subsequently be manufactured according to the updated design. By updating the design to include such a crackstop, the method ensures that, when an RF signal in the specific RF range is emitted by the first device (e.g., by an aggressor device) and couples with the adjacent metallic barrier of the crackstop, the passive filter inhibits transmission of the RF signal noise through the crackstop (i.e., through the metallic barrier(s)) to the second device (e.g., to the victim device) in order to prevent interference with operation of the second device.

BRIEF DESCRIPTION OF THE SEVERAL VIEWS OF THE DRAWINGS

The present invention will be better understood from the following detailed description with reference to the drawings, which are not necessarily drawn to scale and in which:

FIGS. 5A-5D are circuit diagrams illustrating exemplary high pass filters that could be embedded into a crackstop;

DETAILED DESCRIPTION

As mentioned above, integrated circuit (IC) chip manufacturing includes the fabrication, on a semiconductor wafer, of multiple integrated circuits (ICs) having the same design and of crackstops (also referred to as seal rings) laterally surrounding the ICs. The wafer is then diced (i.e., cut up) into individual chips. The individual IC chips are subsequently packaged or mounted directly onto a printed circuit boards (PCB).

Figure 1A:
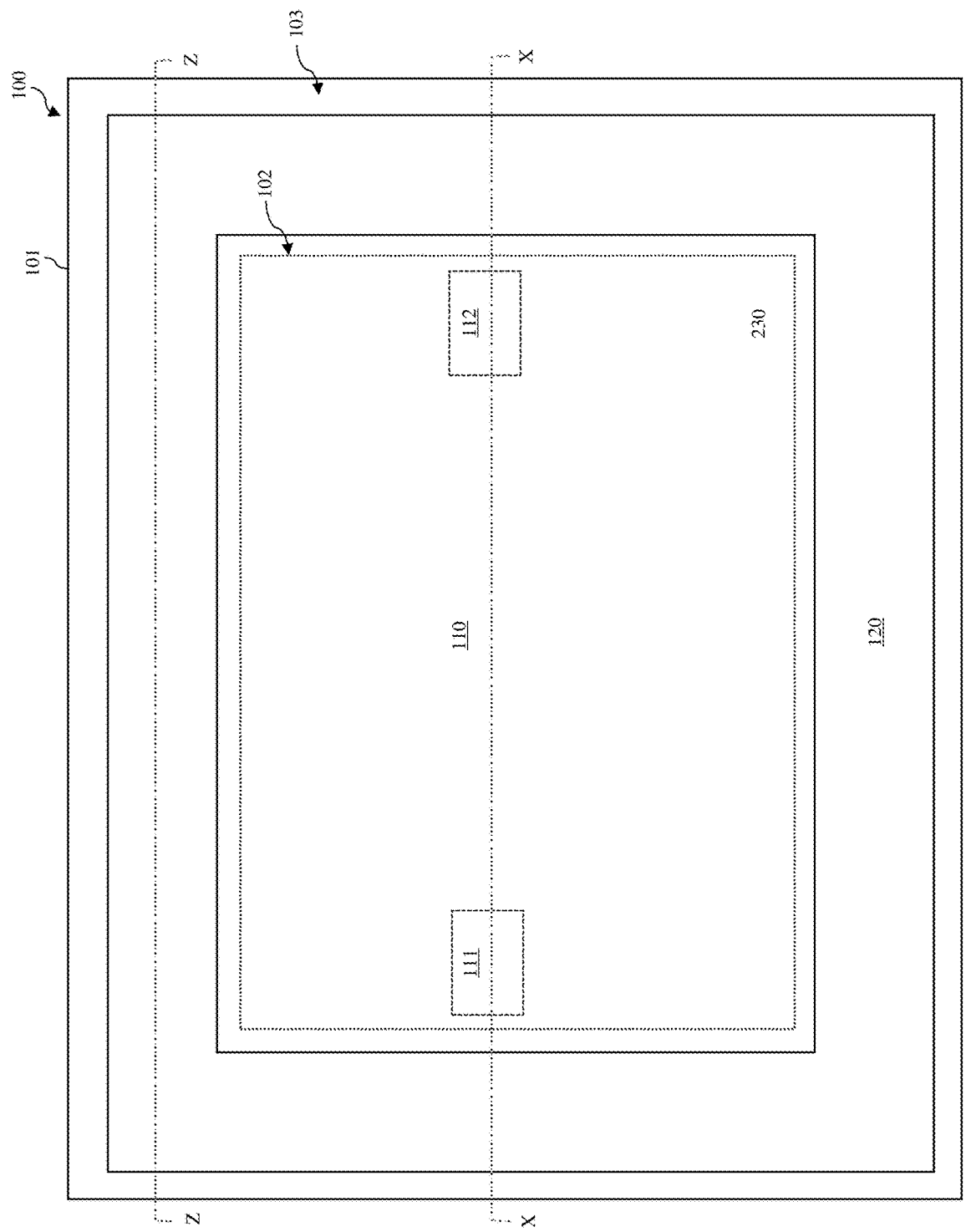
FIG. 1A is a general layout diagram of a radio frequency integrated circuit (RFIC) chip with a continuous crackstop.
Figure 1B:
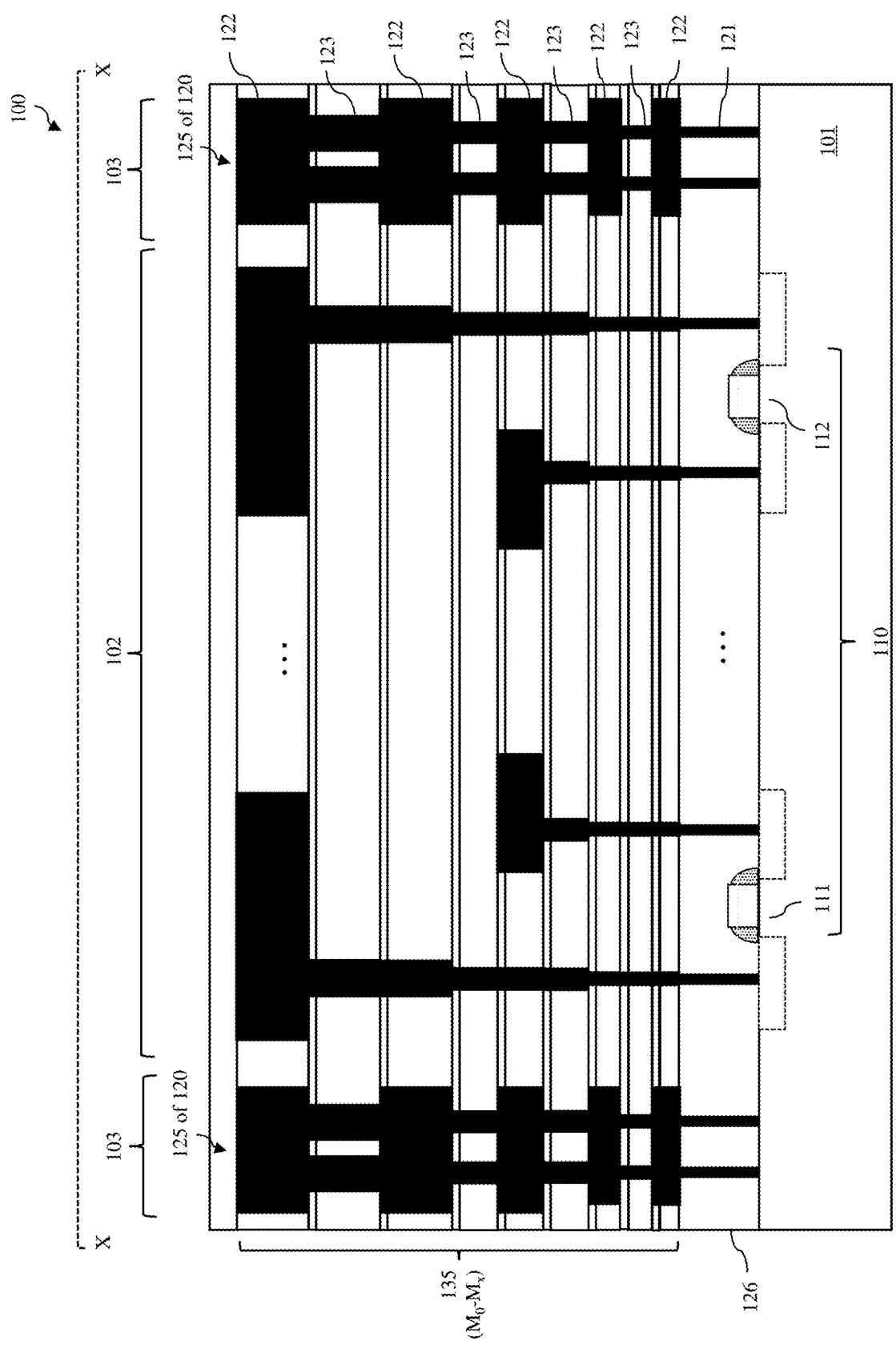
FIGS. 1B and 1C are different cross-section views, respectively, of the RFIC chip of FIG. 1A.
Figure 1C:
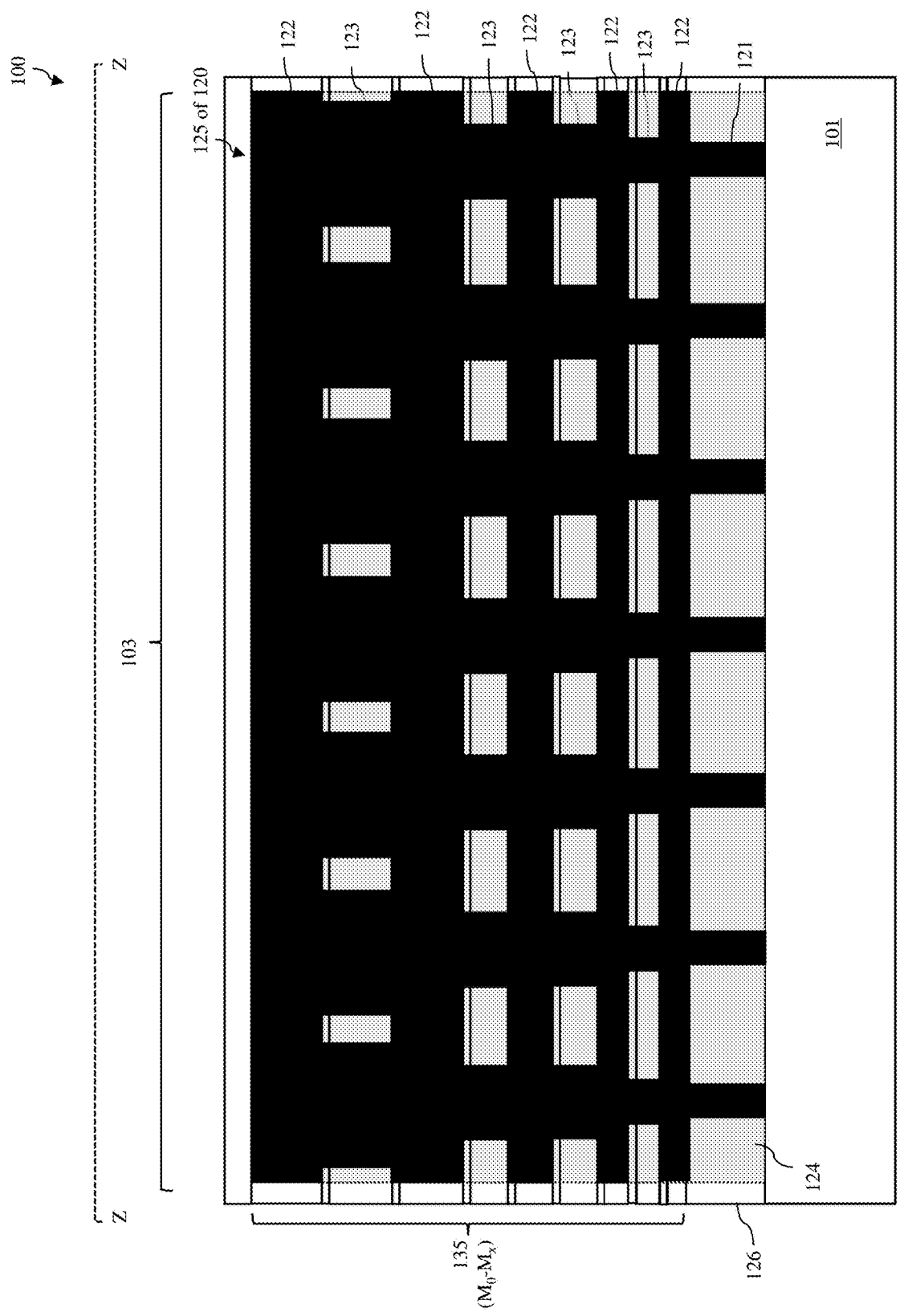

FIG. 1A and FIGS. 1B-1C are a layout diagram and different cross-section diagrams, respectively, of an exemplary chip 100. This chip 100 includes a substrate 101, an integrated circuit (IC) area 110 on a center portion 102 of the substrate 101, and a crackstop 120 on an edge portion 103 of the substrate 101 laterally surrounding the IC area 110. This crackstop 120 includes a metallic barrier 125. The metallic barrier 125 includes an optional middle of the line (MOL) metal contact bar pattern 121, which extends vertically from the substrate 101 through dielectric material 126 to the lowest back end of the line (BEOL) metal level (i.e., to the $M_o$ level) and, on the metal contact bar pattern 121, a stack of alternating layers of metal via bar patterns 123 and metal wire patterns 122, which are within the interlayer dielectric (ILD) layers 135 of BEOL metal levels from the lowest to the highest BEOL metal levels (i.e., from the $M_o$ level to the $M_x$ level).

Figure 1D:
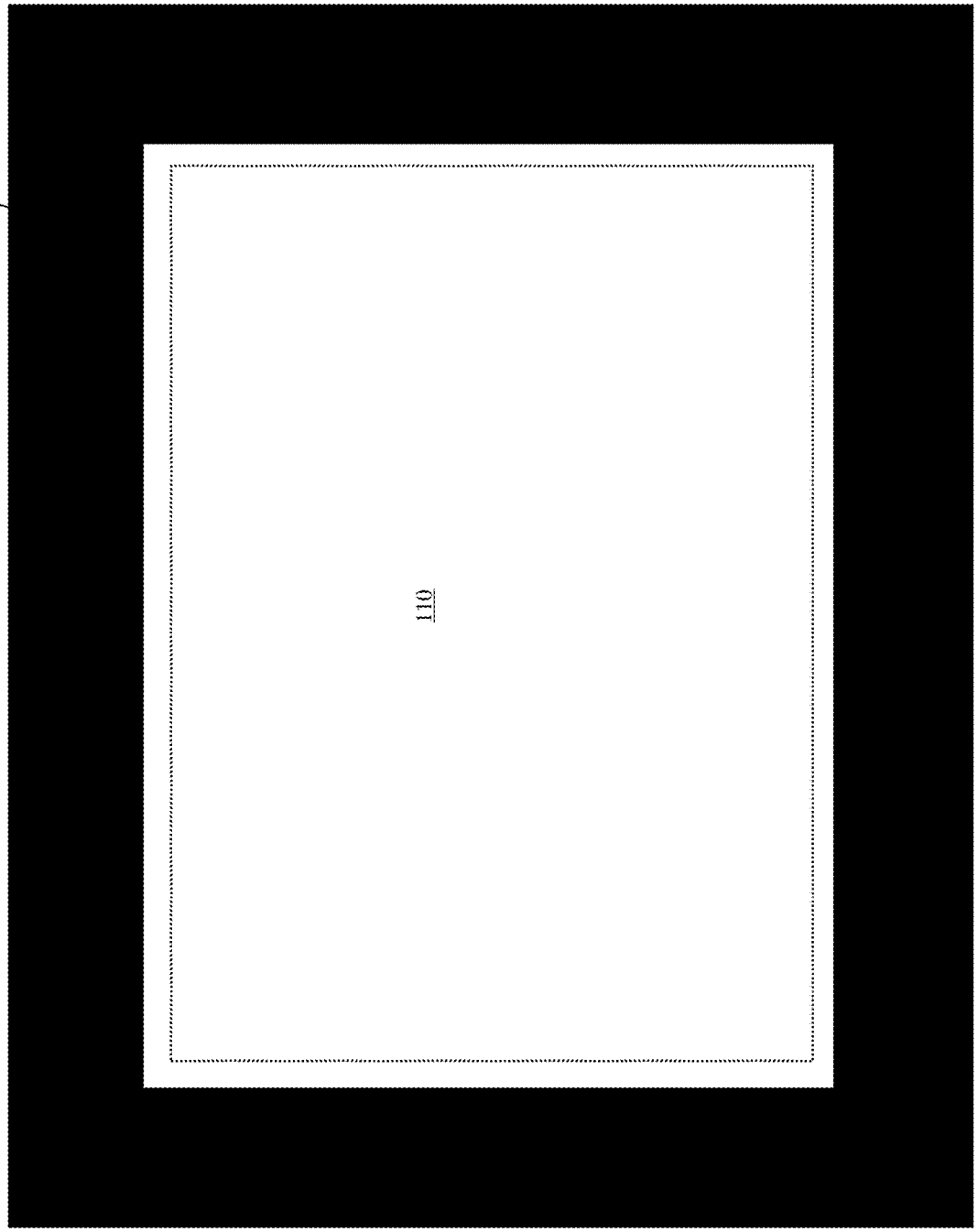
FIGS. 1D and 1E are exemplary layout diagrams of the metal wire pattern and the metal via bar pattern, respectively, within the crackstop of the RFIC chip of FIG. 1A.
Figure 1E:
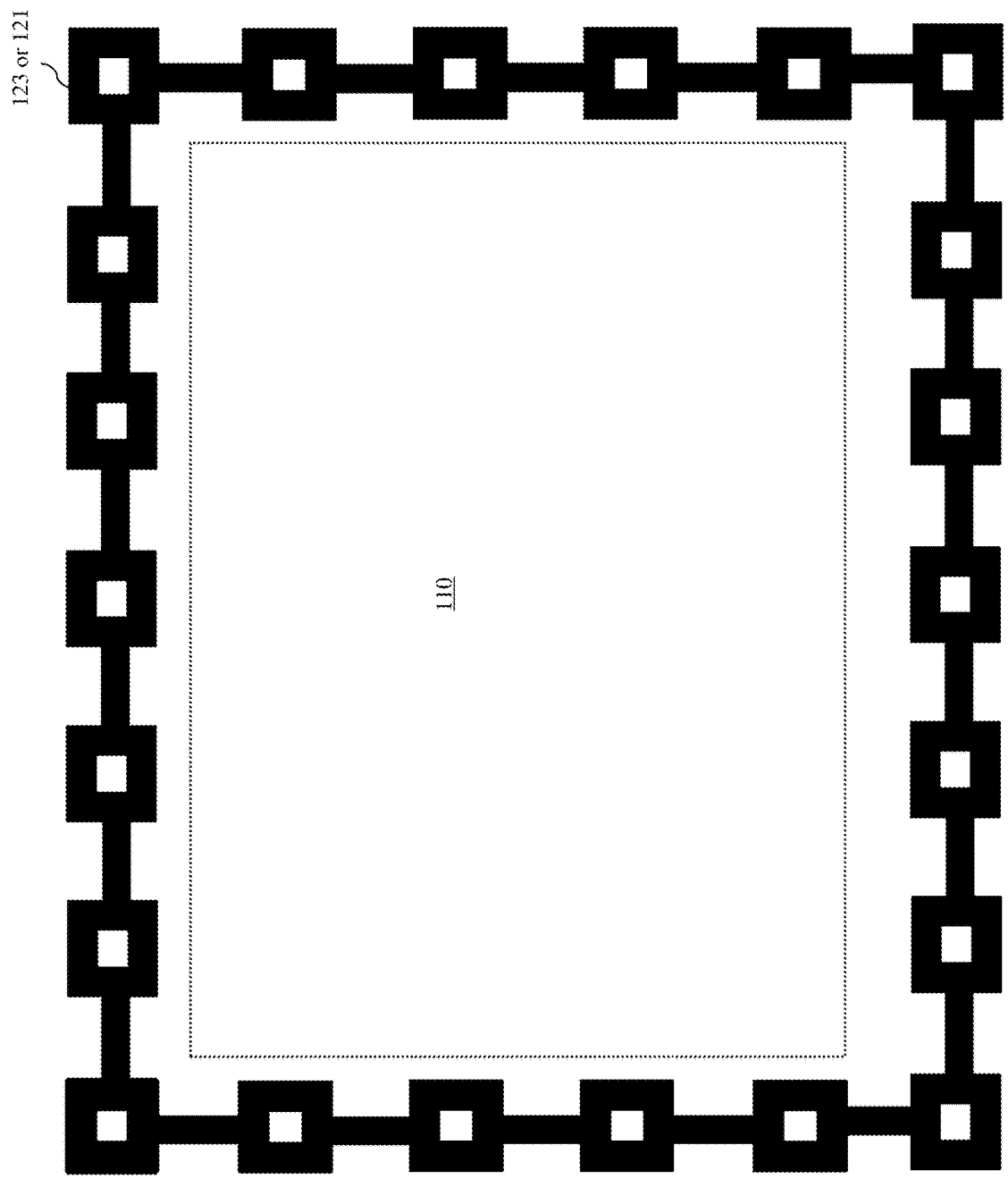

Each of the metal patterns at each level of the metallic barrier 125 (i.e., the optional metal contact bar pattern 121, the metal via bar patterns 123, and the metal wire patterns 122) is continuous such that it completely encircles (i.e., completely laterally surrounds) the IC area 110. Furthermore, within the metallic barrier 125, the metal patterns are vertically aligned and in contact with each other such that the metallic barrier 125 itself is a continuous metallic barrier devoid of any gaps either vertically or horizontally. FIG. 1D shows an exemplary layout of a metal wire pattern 122 that includes metal wires connected to create a rectangular metal structure with linear sides that completely encircle the IC area 110. FIG. 1E shows the layout of a metal via bar pattern 123 that includes metal via bars that are patterned and connected to create a rectangular metal structure with chain-shaped sides that completely encircle the IC area 110. The optional metal contact bar pattern 121 can have essentially the same layout as the metal via bar pattern or a different layout. It should be noted that the gray-shaded area 124 in the cross-section ZZ of FIG. 1C is included to illustrate that, although in the cross-section ZZ there appear to be breaks in the metal contact bar pattern 121 and the metal via bar patterns 323, there is metal material fore and aft of the cross-section ZZ such that the metallic barrier 125 is continuous (i.e., devoid of gaps).

Such a crackstop 120, not only prevents damage during wafer dicing and chip packaging/mounting, but also inhibits moisture ingress into the IC area 110. Unfortunately, on radio frequency (RF) IC chips including, on mmWave IC chips, the continuous metallic barrier 125 of the crackstop 120 can propagate RF noise signals between devices, for example, from a first device 111 and, particularly, an RF device (also referred to herein as an aggressor device) to a second device 112 and, particularly, either another RF device or a non-RF device (also referred to herein as a victim device) and thereby disrupt or interfere with operation of the second device 112.

Figure 2A:
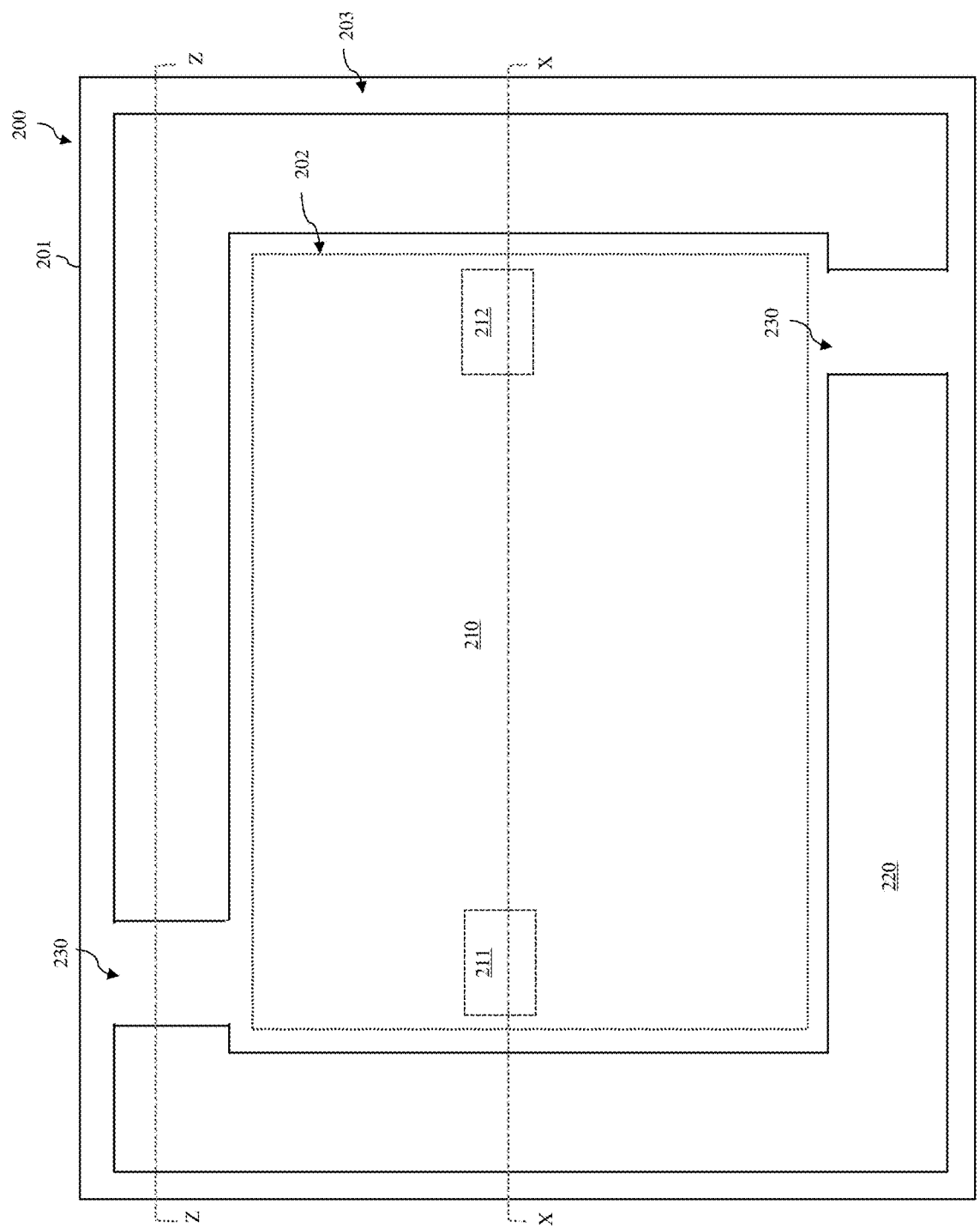
FIG. 2A is a general layout diagram of an RFIC chip with a non-continuous crackstop.
Figure 2B:
FIGS. 2B and 2C are different cross-section views, respectively, of the RFIC chip of FIG. 2A.
Figure 2C:
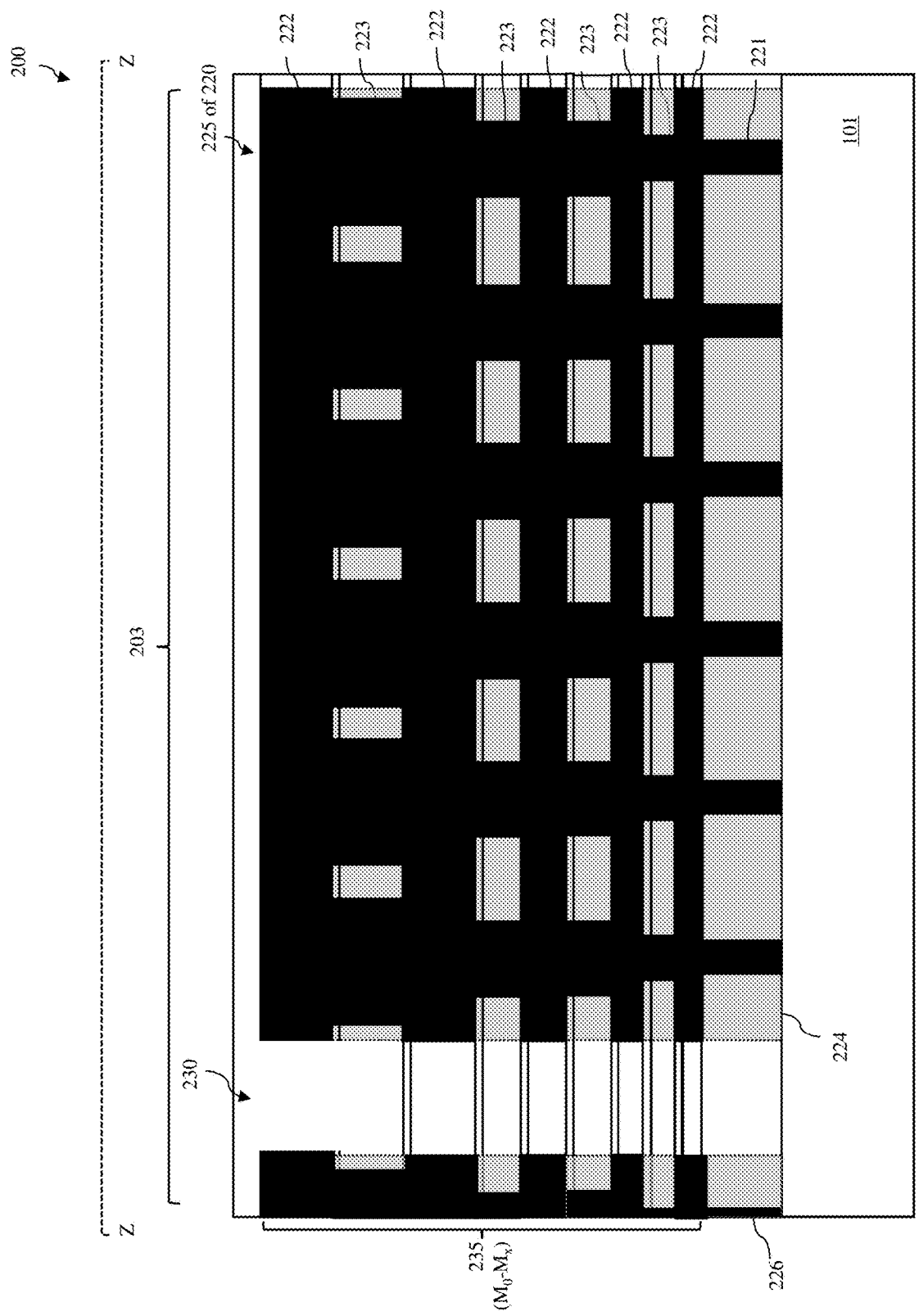

FIG. 2A and FIGS. 2B-2C are a layout diagram and different cross-section diagrams, respectively, of an exemplary chip 200. Like the chip 100, this chip 200 includes a substrate 201, an integrated circuit (IC) area 210 with RF devices (e.g., 211-212) on a center portion 202 of the substrate 201, and a crackstop 220 on an edge portion 203 of the substrate 201 laterally surrounding the IC area 210. This crackstop 220 includes a metallic barrier 225. The metallic barrier 225 includes an optional middle of the line (MOL) metal contact bar pattern 221, which extends vertically from the substrate 201 through dielectric material 226 to the lowest back end of the line (BEOL) metal level (i.e., to the $M_o$ level) and, on the metal contact bar pattern 221, a stack of alternating layers of metal via bar patterns 223 and metal wire patterns 222, which are within the interlayer dielectric (ILD) layers 235 of BEOL metal levels from the lowest to the highest BEOL metal levels (i.e., from the $M_o$ level to the $M_x$ level).

Each of the metal patterns at each level of the metallic barrier 225 (i.e., the optional metal contact bar pattern 221, the metal via bar patterns 223, and the metal wire patterns 222) can be configured in essentially the same manner as the metal patterns in the metallic barrier 125. However, instead of the metal patterns being continuous, each of the metal patterns can include one or more dielectric-filled gaps such that there are dielectric-filled gaps 230 that extend the full height of the metallic barrier 225 of the crackstop 220. Thus, the metallic barrier 225 is broken into discrete metal walls (i.e., not a continuous). It should be noted that the gray-shaded area 224 in the cross-section ZZ of FIG. 2C is included to illustrate that, except at the gaps 230, there is metal material in the metal via bar and metal contact bar patterns fore and aft of the cross-section ZZ. In any case, the dielectric-filled gaps 230 physically block RF noise signal propagation. However, at advanced technology nodes, the ILD material layers 235 in the dielectric-filled gaps 230 are typically low-K or ultra-low-K ILD material layers that are porous in structure. Thus, while these dielectric-filled gaps 230 block RF noise signal propagation, they facilitate moisture ingress into the IC area 210.

In view of the foregoing, disclosed herein are embodiments of a chip and, particularly, a radio frequency integrated circuit (RFIC) chip with a crackstop having one or more embedded noise suppressors (also referred to herein as noise dampeners). Specifically, the RFIC chip can include an integrated circuit (IC) area and a crackstop laterally surrounding the IC area. The crackstop can include a metallic barrier (or, alternatively, concentric metallic barriers) physically separated from the IC area. One or more noise suppressors and, particularly, one or more passive filters (e.g., low pass filter(s), high pass filter(s), band pass filter(s), and/or band stop filter(s)) can be integrated into and, if applicable, between the structure of the metallic barrier(s) in order to inhibit propagation, through the crackstop, of noise signals within a specific RF range. The specific RF range can be, for example, a customer-specified operating parameter. By embedding customized noise suppressor(s) into the crackstop, local signal interference unique to the customer-specified operating parameters can be minimized while also avoiding or at least minimizing the risk of moisture ingress to the IC area. Also disclosed herein are embodiments of a method of forming such an RFIC chip.

Figure 3A:
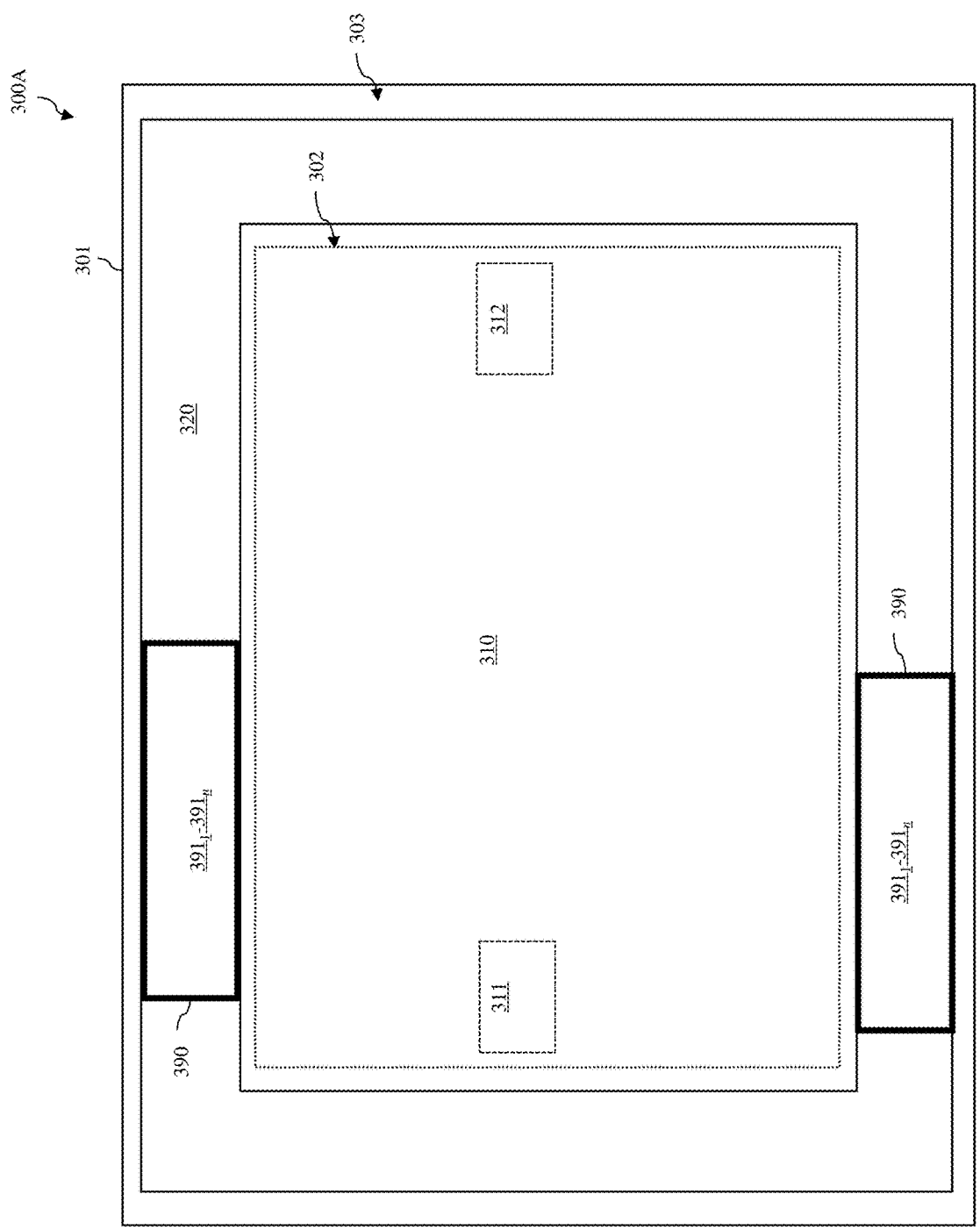
FIGS. 3A-3C are layout diagrams illustrating different disclosed embodiments of an RFIC chip with a crackstop having embedded passive noise suppressor(s)
Figure 3B:
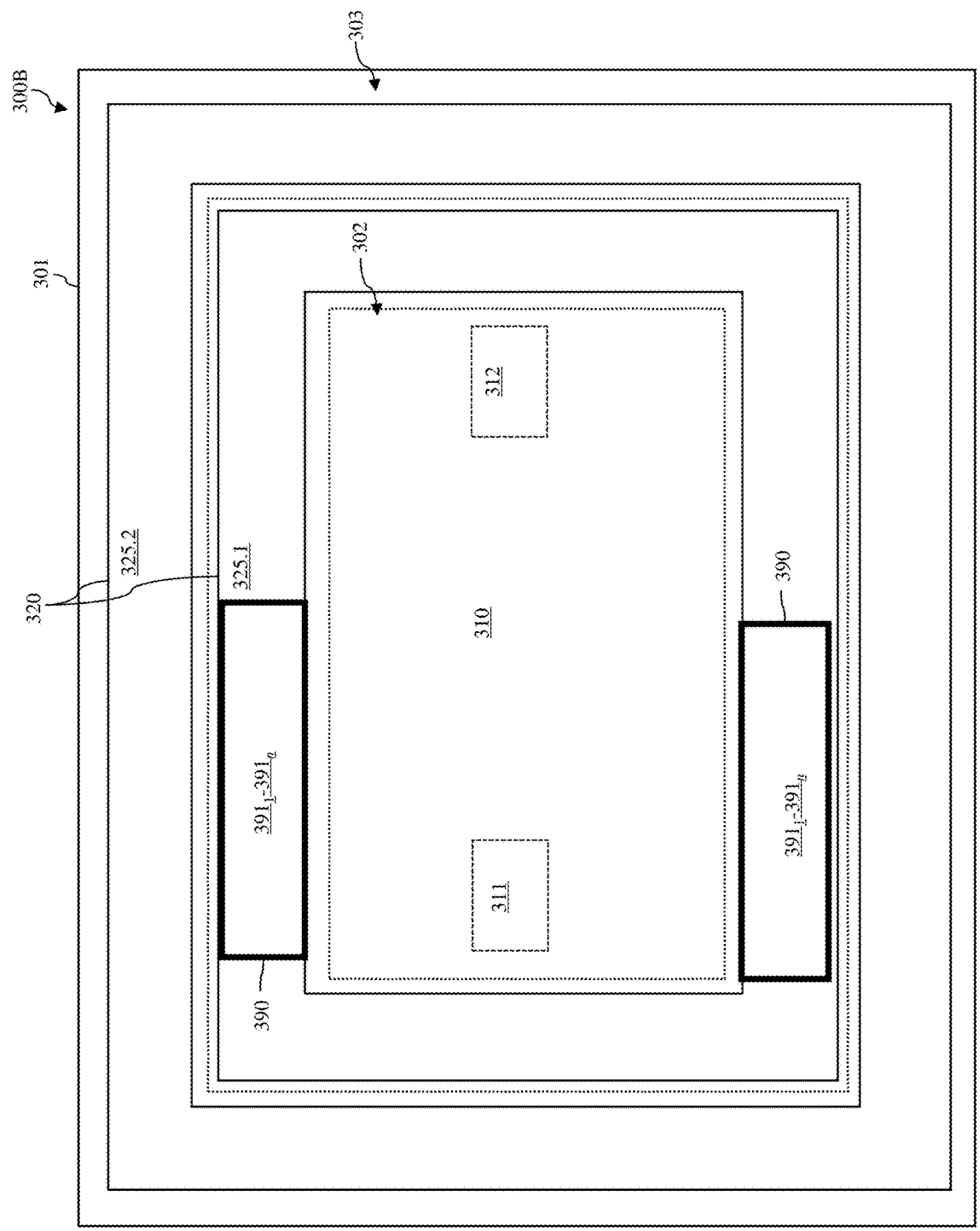
Figure 3C:
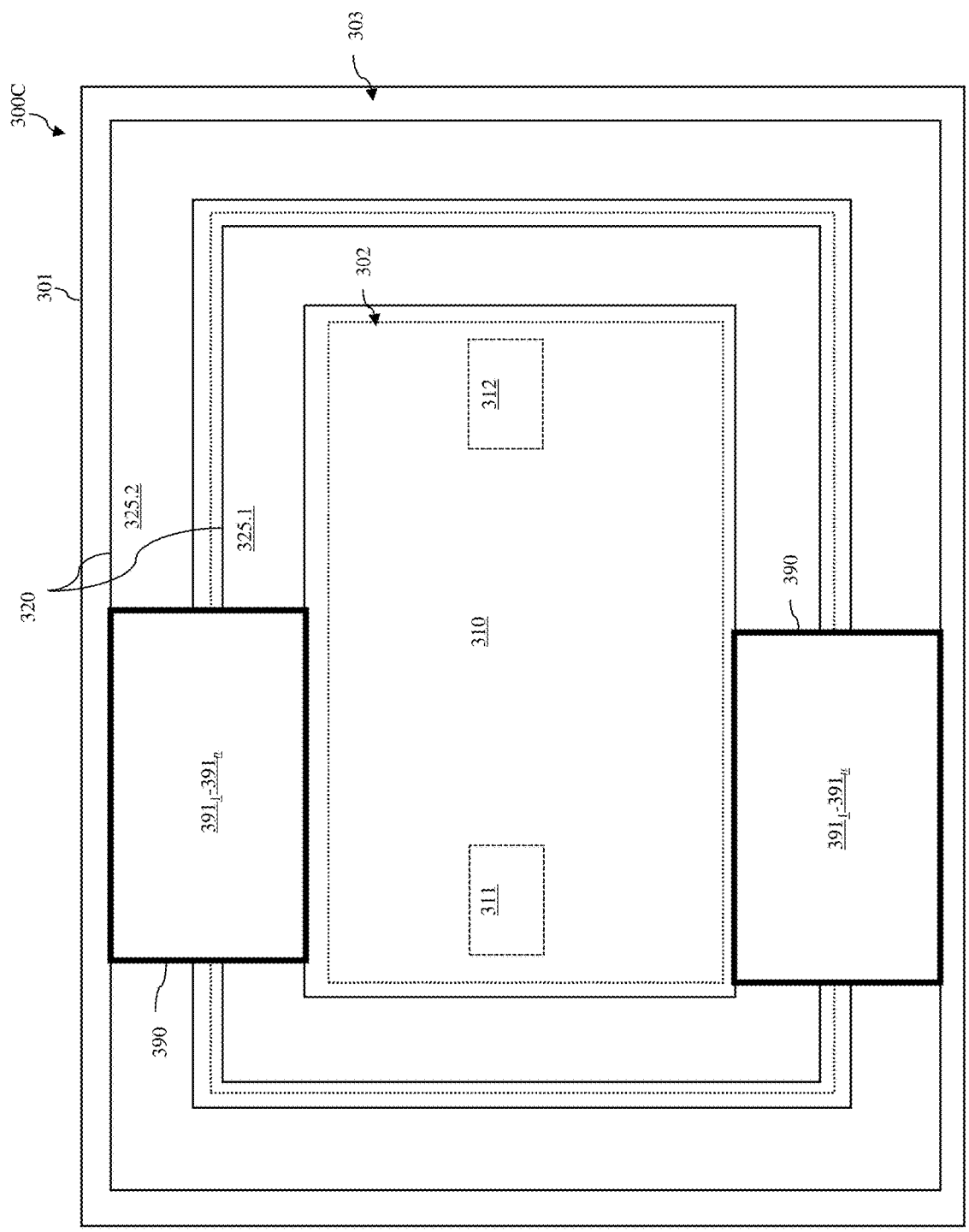
Figure 4A:
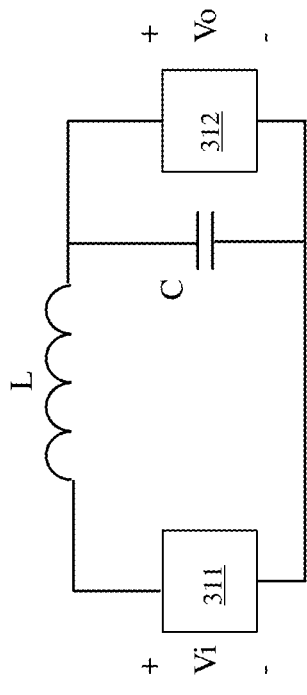
FIGS. 4A-4D are circuit diagrams illustrating exemplary low pass filters that could be embedded into a crackstop.
Figure 4C:
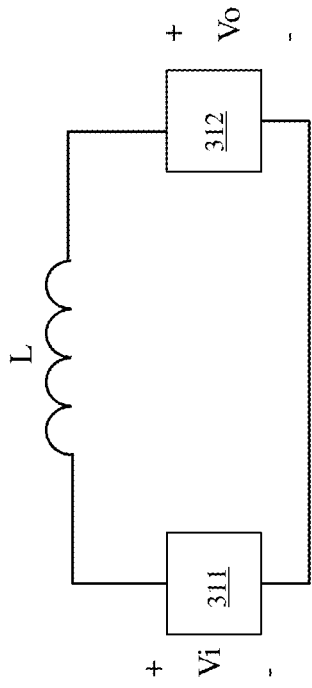
Figure 4B:
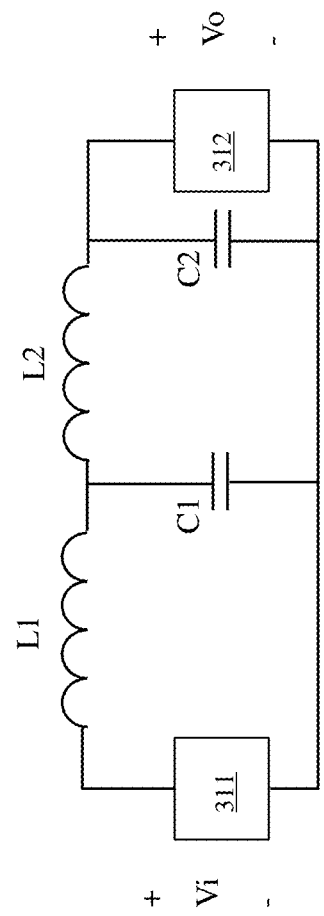
Figure 4D:
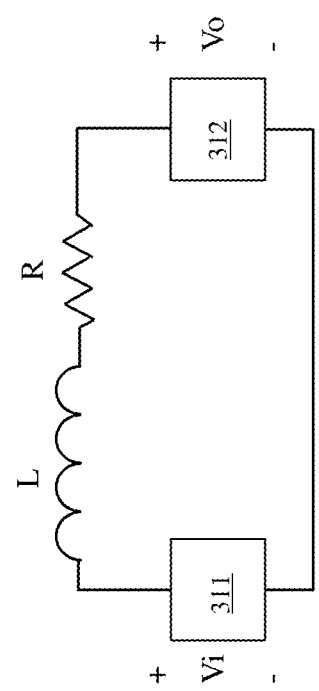
Figure 5A:
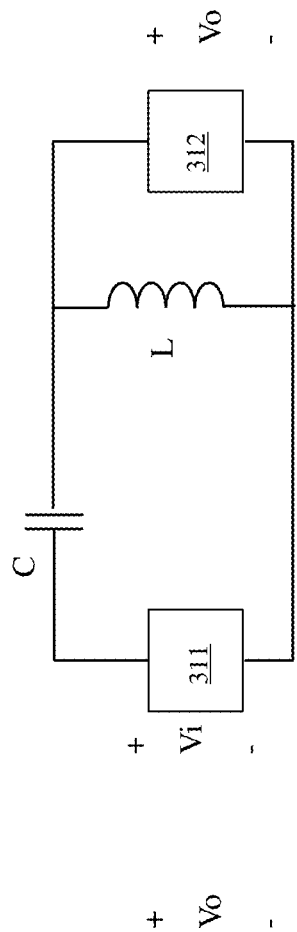
Figure 5B:
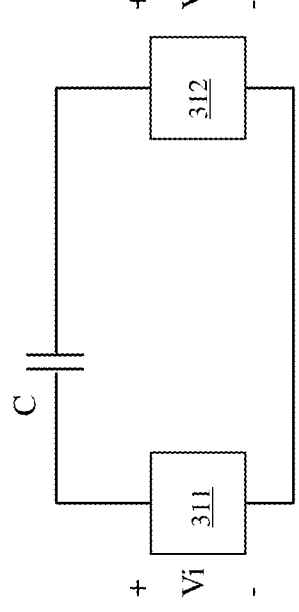
Figure 5B:
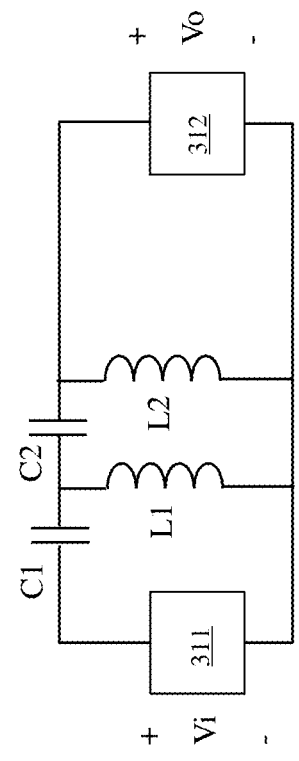
Figure 5D:
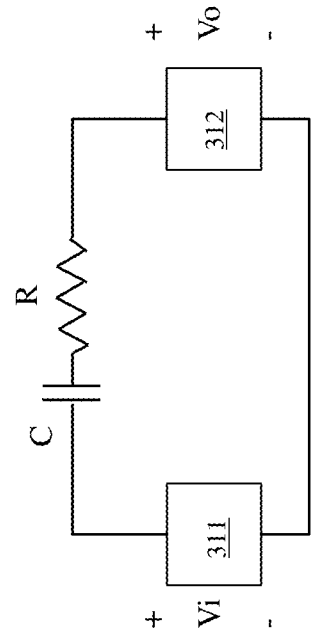

More particularly, referring to FIGS. 3A-3C disclosed herein are embodiments of a radio frequency integrated circuit (RFIC) chip 300A-300C, respectively. The RFIC chip 300A-300C can include a substrate 301. The substrate 301 can be a semiconductor substrate (e.g., a silicon substrate). Alternatively, the substrate 301 can be a semiconductor layer of a semiconductor-on-insulator structure (e.g., a silicon layer of a silicon-on-insulator (all) structure). In any case, the substrate 301 can have a center portion 302 and an edge portion 303.

The RFIC chip 300A-300C can include an integrated circuit (IC) area 310 on the center portion 302 of the substrate 301. The IC area 310 can include an RFIC.

For purposes of this disclosure, an RFIC is an IC, which includes RF devices and/or circuitry configured to operate at frequencies within the radio spectrum and which, optionally, includes other non-RF devices. The radio spectrum includes RF signals with frequencies ranging from 3 Hz to 3 THz. RFIC applications include, but are not limited to, wireless communication applications (e.g., mobile phones, Wi-Fi devices, Bluetooth devices, satellite transceivers, etc.), radar system applications, military applications, imaging applications, etc. $4^{th}$ generation (4G) RFIC applications operate at or below 6 GHz. Developing $5^{th}$ generation (5G) RFIC applications are being designed to operate in an ultra-wide band (UWB), which includes the same sub-6 GHz band previously covered by 4G applications and a lower portion of the millimeter wave band (mmWave band) (e.g., 24 GHz to 100 GHz). Those skilled in the art will recognize that the mmWave band is a sub-band within the radio spectrum and includes RF signals with extremely high frequencies ranging from 24 GHz to 300 GHz. The wavelengths of the RF signals within this mmWave band range from 1 mm at 300 GHz to 10 mm at 30 GHz (hence the name).

In any case, the specific RF frequency range employed for the RFIC in the IC area 310 can be, for example, a customer-specified operating parameter. For purposes of illustration, only a first device 311 and a second device 312 are shown in the figures. The first device 311 can be an RF device, such as an RF transistor, and is referred to herein as an aggressor device. The second device 312 can be another RF device (e.g., another RF transistor) or some other non-RF device and is referred to herein as a victim device. It should be understood that typically the IC area 310 of an RFIC chip 300A-300C will include more than two devices. Such devices can include, but are not limited to, RF front-end devices (e.g., a receiver and/or a transmitter and/or a transceiver), devices for signal processing, etc.

The RFIC chip 300A-300C can further include a crackstop 320 on the edge portion 303 of the substrate 301. In all of the embodiments, the crackstop 320 can include one metallic barrier (e.g., see the single metallic barrier 325 of FIG. 3A) or, alternatively, multiple concentric metallic barriers (e.g., see the first metallic barrier 325.1 and the second metallic barrier 325.2 in FIGS. 3B-3C) that laterally surround the IC area 310. The metallic barrier(s) 325 or 325.1-325.2 can be physically separated from the IC area 310. Furthermore, the space between the IC area 310 and the adjacent metallic barrier 325 or 325.1 can be filled with dielectric material and no electrically conductive interconnect structure (e.g., metal wire, metal via bar, metal contact bar, or the like) can electrically connect the metallic barrier(s) 325 or 325.2-325.2 to the IC area 310 or, more specifically, to any device or local interconnect within the IC area 310. That is, the metallic barrier(s) can be electrically isolated from the IC area 310.

Additionally, one or more passive noise suppressors (also referred to herein as noise dampeners) and, particularly, one or more passive filters 390 can be integrated into the structure of the metallic barrier(s). Each passive filter 390 can include at least one electromagnetic device (e.g., a resistor, an inductor, a capacitor, or a stub) and can be configured so as to inhibit propagation of RF noise signals within a specific RF range through the crackstop 320 between different locations on the RFIC chip 300A-300C. By embedding passive noise suppressor(s) into the crackstop 320, local signal interference between devices (e.g., between the aggressor device 311 and the victim device 312) can be minimized while also avoiding or at least minimizing the risk of moisture ingress to the IC area.

Specifically, as mentioned above, each passive filter 390 can include one or more electromagnetic devices $391_1$-$391_n$. The electromagnetic device(s) $391_1$-$391_n$ can include, for example, resistor(s), inductor(s), capacitor(s) and/or stub(s). The electromagnetic device(s) $391_1$-$391_n$ can be electrically connected (e.g., in series and/or in parallel) between the aggressor and victim devices 311-312 in such a way as to inhibit noise signals, which are within a specific RF range, from being propagated from the aggressor device 311 to the victim device 312. This specific RF range can be, for example, a customer-RF range for operation of the RF devices within the IC area 310.

The passive filter(s) 390 can be, for example, passive low pass filter(s), passive high pass filter(s), passive band pass filter(s) and/or passive band stop filter(s). A "low pass filter" refers to a passive filter configured to only enable propagation of signals that are below some specific frequency (e.g., below the minimum frequency of the specific RF range). A "high pass filter" refers to a passive filter configured to only enable propagation of signals that are above some specific frequency (e.g., below the maximum frequency of the specific RF range). A "band pass filter" refers to a passive filter configured to only enable propagation of signals that are within a specific band (e.g., some band below the minimum frequency of specific RF range or some band above the maximum frequency of the specific RF range). A "band stop filter" (also referred to herein as a "notch filter") refers to a passive filter configured to only enable propagation of signals that are outside of a certain band (e.g., some band that corresponds to or is broader than the specific RF range). Thus, any of the above-mentioned types of passive filters 390 can be configured so that at least RF noise signals within the specific RF range are inhibited from being propagated from the aggressor device to the victim device.

FIGS. 4A-4D are circuit diagrams illustrating exemplary low pass filters that could be embedded in a crackstop 320 of the RFIC chip 300A, 300B or 300C along a signal path between aggressor and victim devices.

FIGS. 5A-5D are circuit diagrams illustrating exemplary high pass filters that could be embedded in a crackstop 320 of the RFIC chip 300A, 300B or 300C along a signal path between the aggressor and victim devices.

Figure 6A:
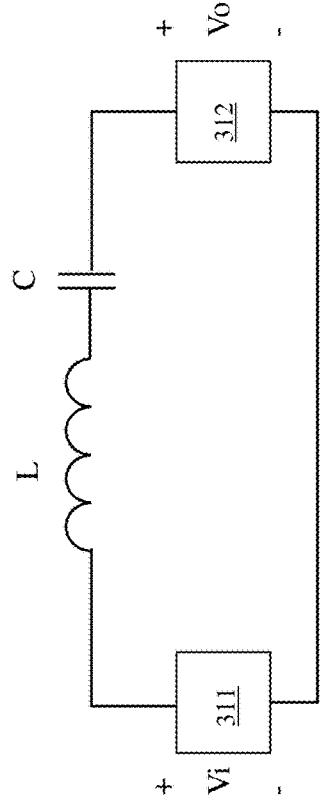
FIGS. 6A-6C are circuit diagrams illustrating exemplary band pass filters that could be embedded into a crackstop.
Figure 6C:
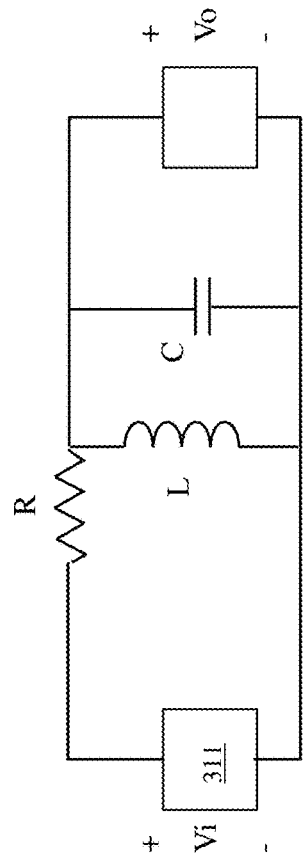
Figure 6B:
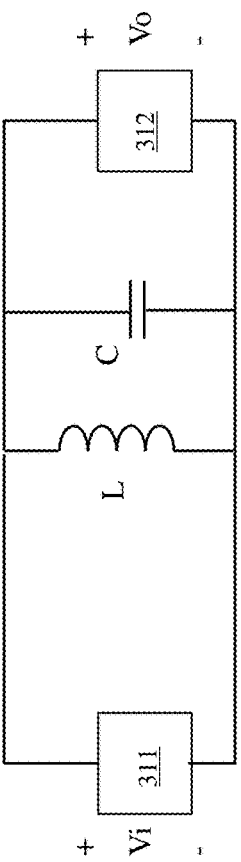

FIGS. 6A-6C are circuit diagrams illustrating exemplary band pass filters that could be embedded in a crackstop 320 of the RFIC chip 300A, 300B or 300C along a signal path between the aggressor and victim devices.

FIGS. 7A-7D are circuit diagrams illustrating exemplary band stop filters (i.e., notch filters) that could be embedded in a crackstop 320 of the RFIC chip 300A, 300B or 300C along a signal path between the aggressor and victim devices.

As mentioned above, passive filters can also be formed using stubs. For purposes of this disclosure, a stub (also referred to as a resonant stub) is an elongated metal feature that is connected at one end only. Although not illustrated in the figures, it should be understood that different combinations of stubs (i.e., numbers, sizes, shapes, placement, etc.) can be added to the structure of the metallic barrier(s) to create one or more electromagnetic devices, such as resistor(s), inductor(s), and/or capacitor(s), and thereby create a passive filter.

Passive filters 390, such as those described above and illustrated in FIGS. 4A-7D could be incorporated into the crackstop 320 of the RFIC chip 300A of FIG. 3A, the RFIC chip 300B of FIG. 3B, or the RFIC chip 300C of FIG. 3C in order to inhibit propagation of RF noise signals through the crackstop 320 from an aggressor device 311 to a victim device 312 and thereby avoid interference with operation of the victim device 312. It should be understood that the passive filters shown in FIGS. 4A-7D are not intended to be limiting. Various other passive filters that incorporate electromagnetic device(s) (e.g., resistor(s), inductor(s), capacitor(s) and/or stub(s)), including other low pass filters, other high pass filters, other band pass filters, and other band stop filters are well known in the art. Such passive filters could, alternatively, be incorporated into the crackstop 320 of the RFIC chip 300A of FIG. 3A, the RFIC chip 300B of FIG. 3B, or the RFIC chip 300C of FIG. 3C in order to inhibit propagation of RF noise signals through the crackstop 320 from an aggressor device 311 to a victim device 312 and thereby avoid interference with operation of the victim device 312.

FIGS. 8A-8E illustrate in greater detail one exemplary embodiment of an RFIC chip 300A where the crackstop 320 includes a single metallic barrier 325 and one or more passive filters. Each passive filter can include one or more electromagnetic devices embedded within the structure of the metallic barrier 325. The passive filter(s) can be, for example, low pass filters 390A configured according to the circuit diagram of FIG. 4A.

Figure 8A:
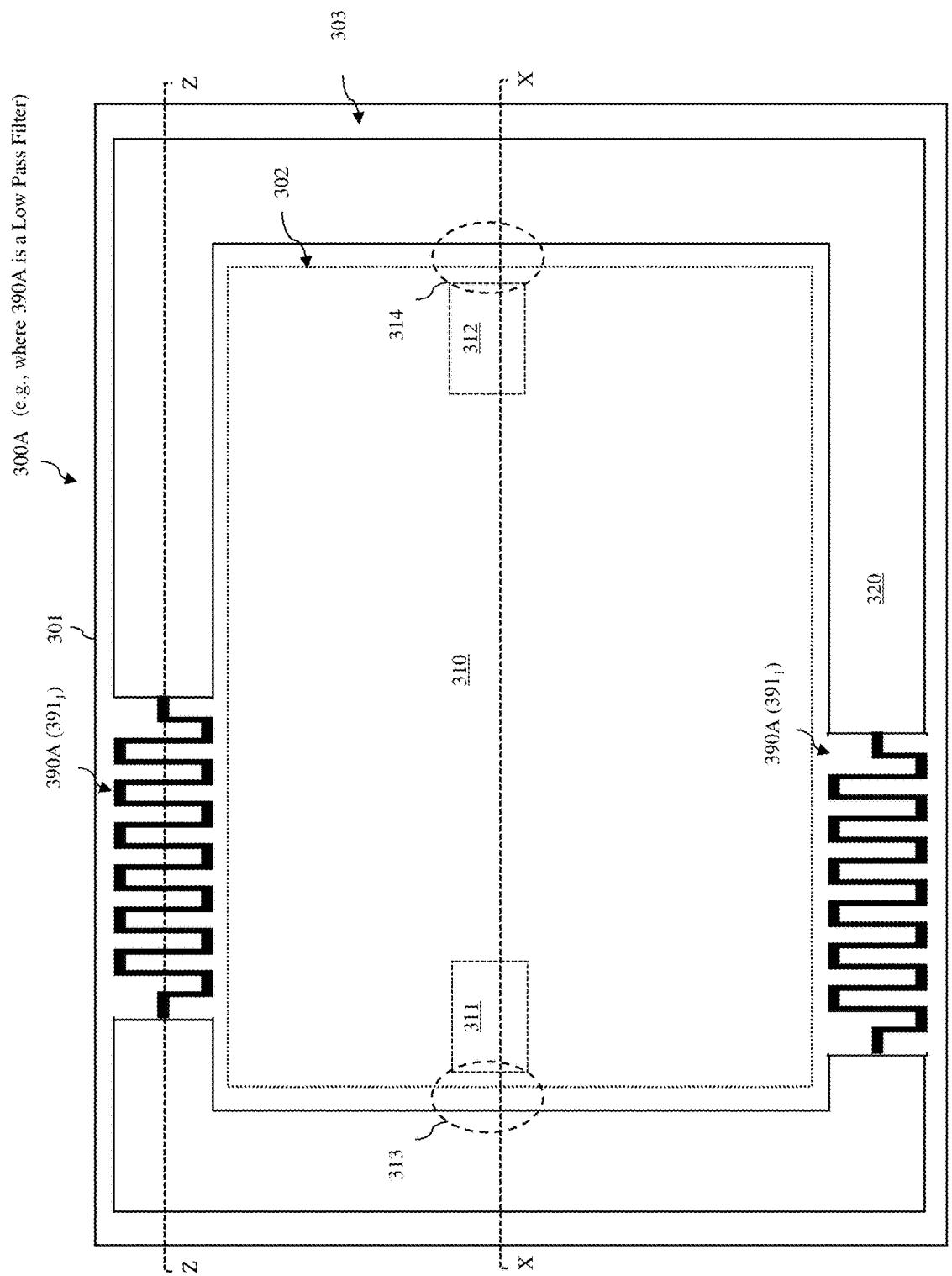
FIG. 8A is a layout diagram of an exemplary RFIC chip, such as that shown in FIG. 3A, where each embedded noise suppressor embedded in the crackstop is specifically a low pass filter, such as that shown in FIG. 4A.
Figure 8B:
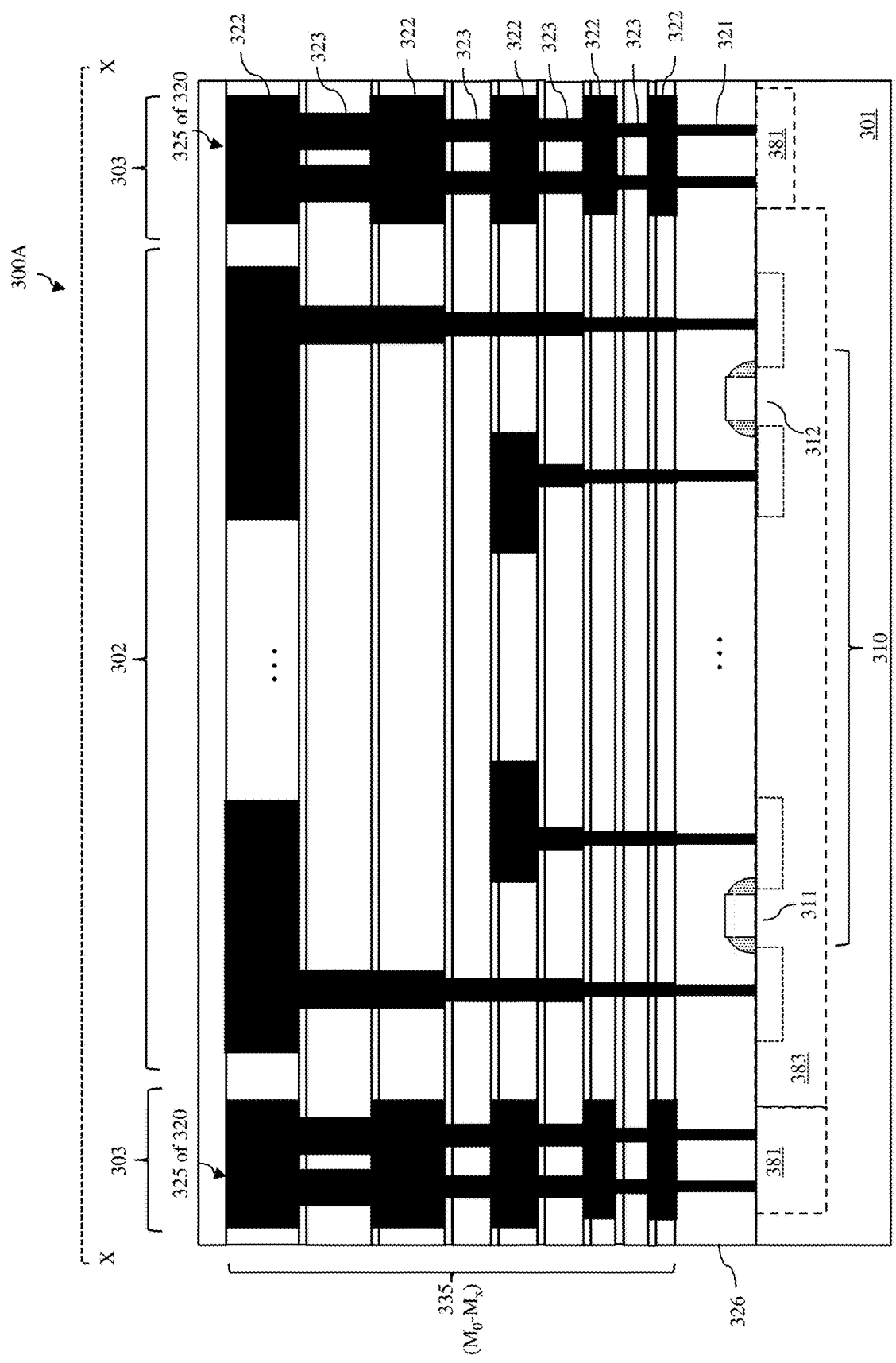
FIGS. 8B and 8C are different cross-section views, respectively, of the RFIC chip of FIG. 8A.
Figure 8C:
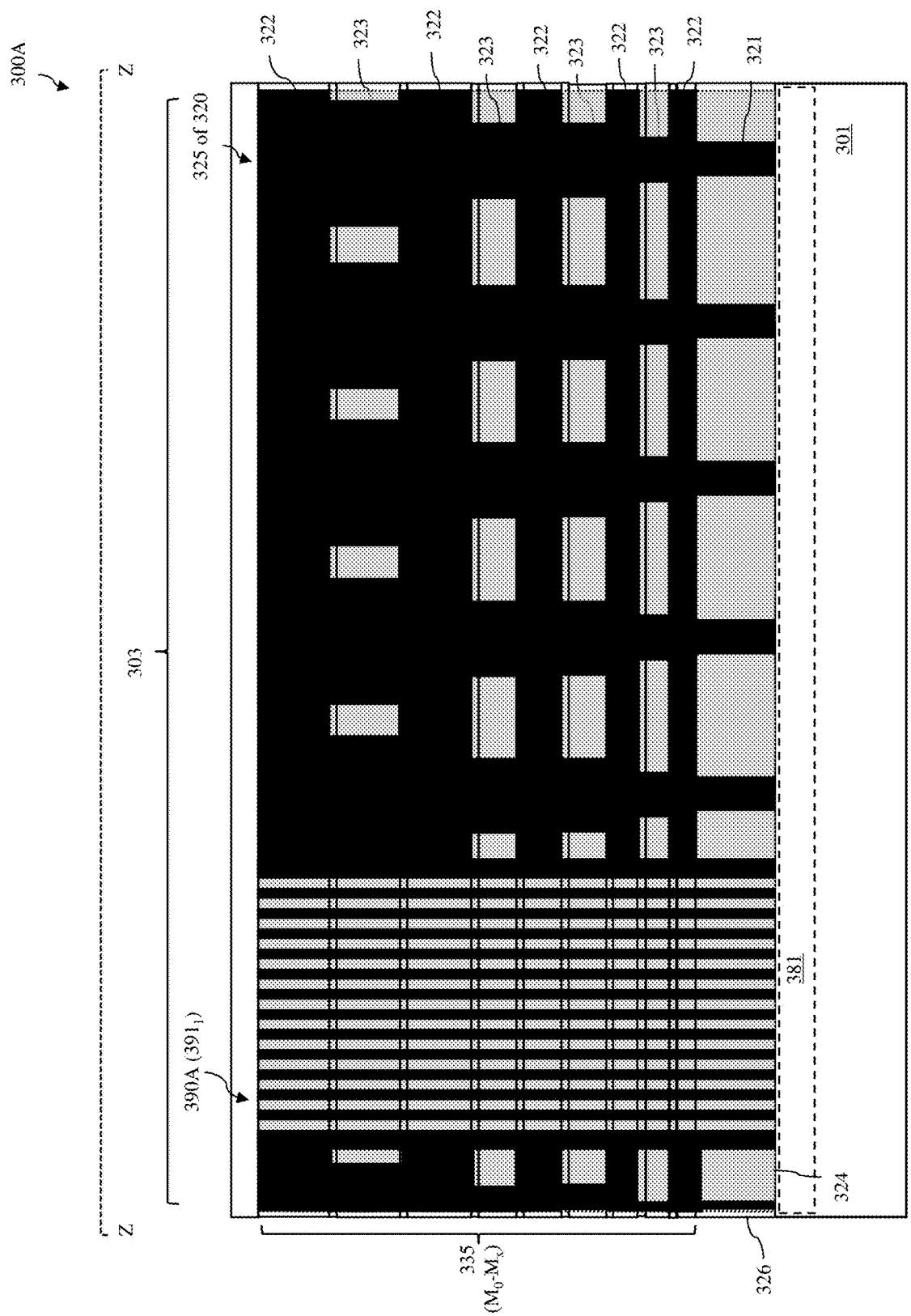

More specifically, FIG. 8A and FIGS. 8B-8C are a layout diagram and different cross-section diagrams, respectively, of an exemplary the RFIC chip 300A. This RFIC chip 300A can include a semiconductor substrate 301 and an IC area 310 on a center portion 302 of the semiconductor substrate 301. The IC area 310 can include, but is not limited to, a first device 311 (e.g., an RF device, such as an RF transistor, also referred to herein as an aggressor device) and a second device 312 (e.g., another RF device or some other non-RF device, also referred to herein as a victim device). The RFIC chip 300A can further include a crackstop 320 on an edge portion of the semiconductor substrate 301. The crackstop 320 can include a single metallic barrier 325, which laterally surrounds and is physically separated from the IC area 310.

This single metallic barrier 325 can include an optional middle of the line (MOL) metal contact bar pattern 321, which extends vertically from the substrate 301 through dielectric material 326 to the lowest back end of the line (BEOL) metal level (i.e., to the $M_o$ level) and, on the metal contact bar pattern 321, a stack of alternating layers of metal via bar patterns 323 and metal wire patterns 322, which are within the interlayer dielectric (ILD) layers 335 of BEOL metal levels from the lowest to the highest BEOL metal levels (i.e., from the $M_o$ level to the $M_x$ level).

Each metal pattern at each level of the metallic barrier 325 (i.e., the optional metal contact bar pattern 321, the metal via bar patterns 323, and the metal wire patterns 322) can be continuous so that it completely encircles (i.e., completely laterally surrounds) the IC area 310. Furthermore, the metal patterns at the different levels can be vertically aligned and in contact with each other such that the metallic barrier 325 itself is a continuous metallic barrier devoid of any gaps or breaks either vertically or horizontally.

Figure 8D:
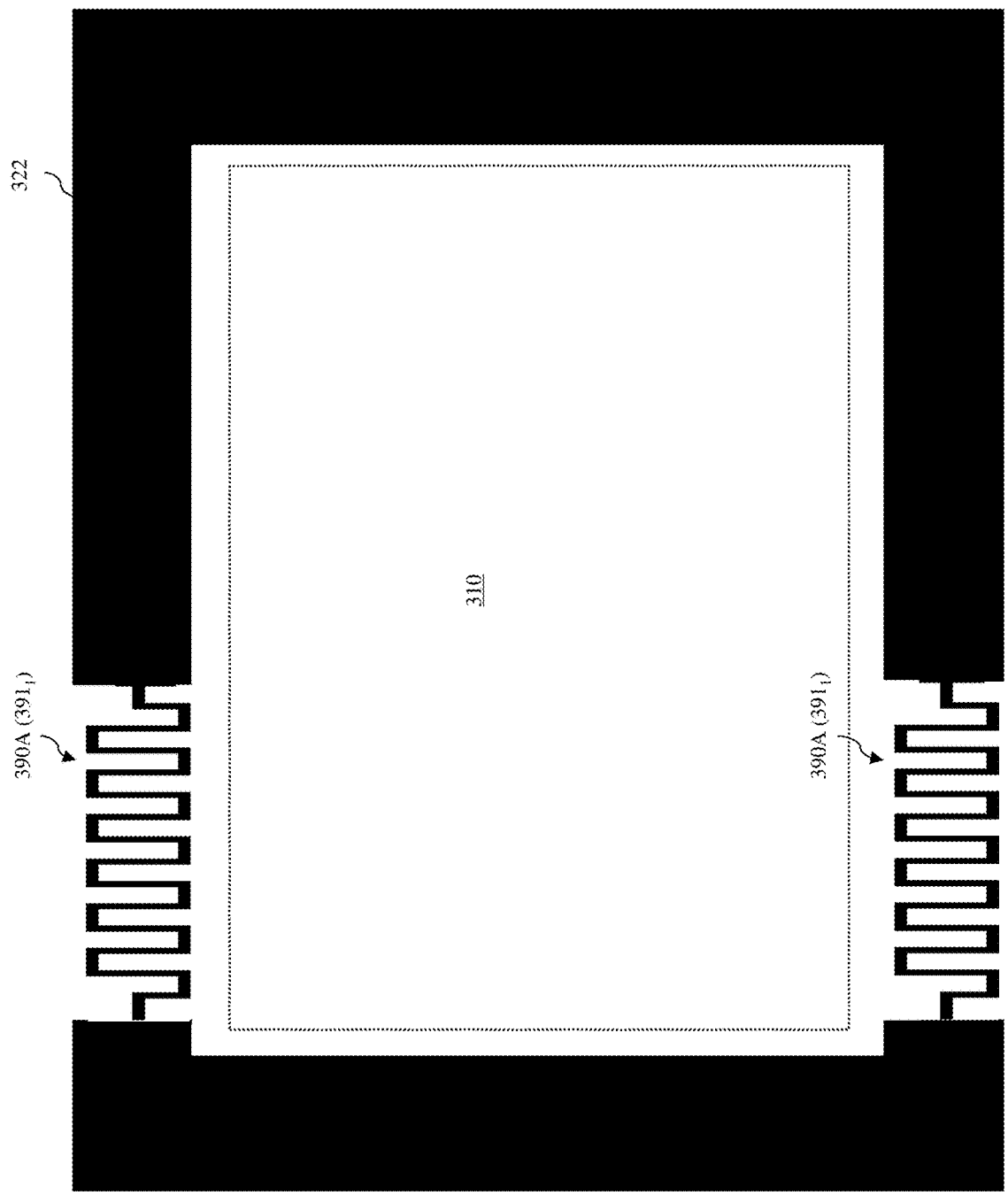
FIGS. 8D and 8E are exemplary layout diagrams of the metal wire pattern and the metal via bar pattern, respectively, within the crackstop of the RFIC chip of FIG. 8A.
Figure 8E:
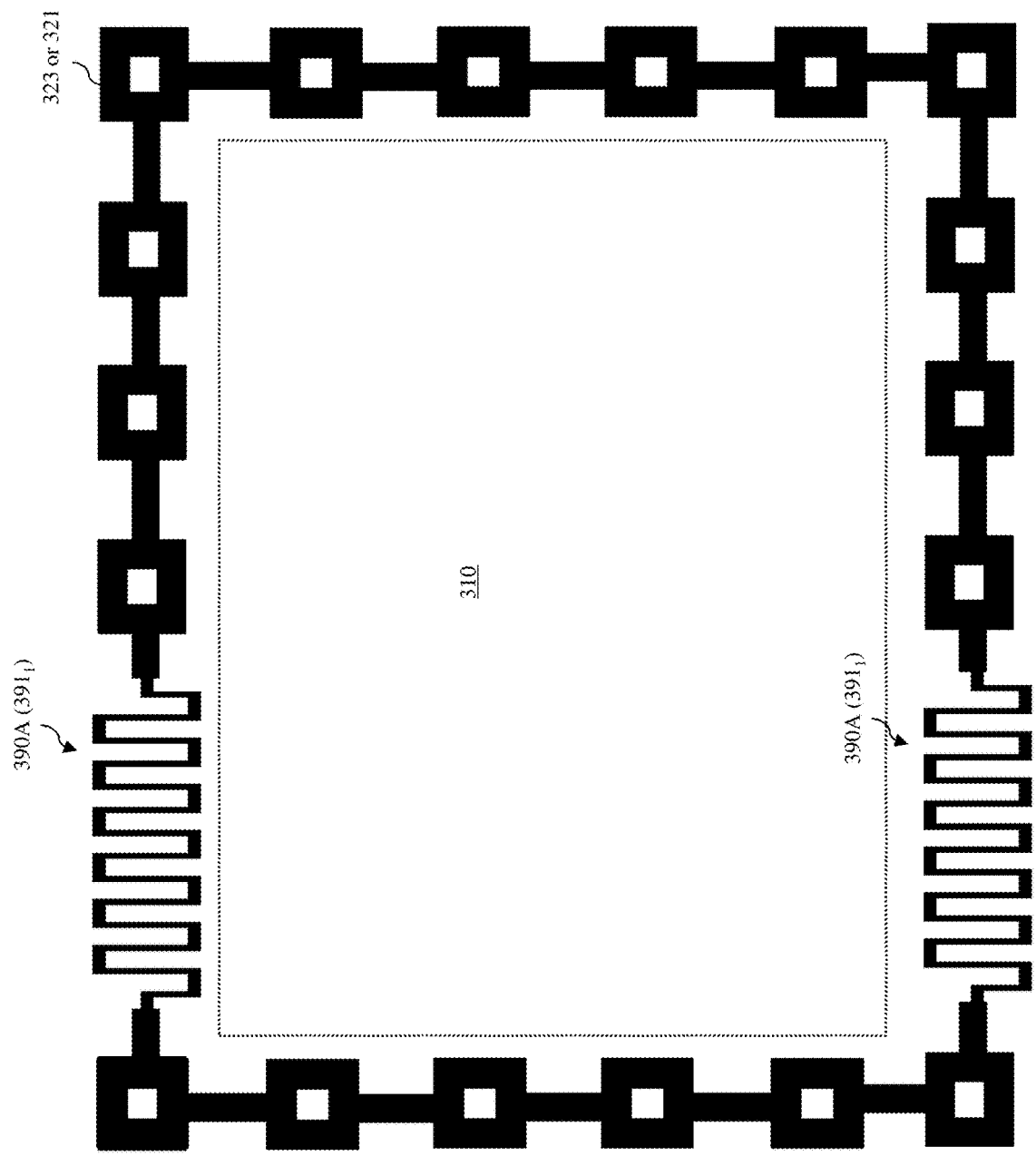

FIG. 8D shows an exemplary layout of a metal wire pattern 322 that includes metal wires that are patterned and connected to create a metal shape that completely encircles the IC area 310. For example, the metal wires within each metal wire pattern can include essentially linear wires and these wires can form the sides of a metal rectangle around the IC area 310. FIG. 8E shows the layout of a metal via bar pattern 323 that includes metal via bars that are patterned and connected to create essentially the same metal shape (e.g., a metal rectangle) as in the metal wire patterns. For purposes of illustration, the metal via bars within each metal via bar pattern are shown as being patterned into essentially linear metal chains that form the sides of a metal rectangle around the IC area. FIGS. 8D-8E are provided for illustration purposes and are not intended to be limiting. Alternatively, the metal shape at each level around the IC area can be different (e.g., circular, oval, etc.) and/or the pattern, particularly, of the metal via bars that form the sides of the metal shapes in the metal via bar patterns can vary. For example, the linear metal chains can have a more complex shape. The optional metal contact bar pattern 321 can have essentially the same layout as the metal via bar pattern or a different layout.

In addition to the features of the metal patterns described above, each metal pattern at each level of the metallic barrier 325 of the crackstop 320 of the RFIC chip 300A can include at least one section that is specifically patterned into the shape(s) of the electromagnetic device(s) for a passive filter, as illustrated in FIGS. 8D-8E. For example, for each low pass filter 390A, each metal pattern at each level in the metallic barrier 325 can include a section that is specifically patterned into the shape of an inductor 391$i$. From level-to-level, these sections that are patterned into the shape(s) of electromagnetic device(s) can be essentially the same and vertically aligned such that the resulting electromagnetic device(s) extend the full height of the metallic barrier 325. For example, for a low pass filter 390A, from level-to-level, these sections that are patterned into the shape(s) of inductors can be essentially the same and vertically aligned such that the resulting inductor 391$_1$ is embedded in the metallic barrier 325 and extends the full height of the metallic barrier 325, as shown in FIG. 8C.

Furthermore, these sections that are patterned into the shape(s) of the electromagnetic device(s) can be strategically placed along the metallic barrier 325 between potential coupling areas 313-314 with the aggressor and victim devices 311-312. For example, in this case, the inductor 391$_1$ of each low pass filter 390A can be placed between a first coupling area 313 (i.e., a coupling area between the crackstop 320 and the first device 311 at a first location within the IC area 310 near the perimeter) and a second coupling area 314 (e.g., a coupling area between the crackstop 320 and the second device 312 at a second location within the IC area 310 near the perimeter). Such a low pass filter 390A can be employed to ensure that, when any RF noise signals above some specific frequency (e.g., above the minimum frequency of the specific RF range at which the RFIC chip operates) is emitted by the first device 311 and couples with the metallic barrier 325 at the first coupling area 313, transmission of the RF noise through the metallic barrier 325 to the second coupling area 314 is inhibited and, thus, interference with operation of the second device 312 is avoided.

It should be noted that the gray-shaded area 324 in the cross-section ZZ of FIG. 8C is included to illustrate that, although in the cross-section ZZ there appear to be breaks in the metal contact bar pattern 321 and the metal via bar patterns 323, there is metal material fore and aft of the cross-section ZZ with the single metallic barrier 325 being continuous (i.e., devoid of gaps) even across the sections that are specifically patterned into the shape(s) of the electromagnetic device(s). Thus, in the exemplary RFIC chip 300A shown in FIGS. 8A-8E the single metallic barrier 325 can inhibit ingress of moisture to the IC area 310. It should, however, be understood that having a single metallic barrier 325 limits the types of passive filters that could potentially be incorporated therein. For example, a passive filter that includes parallel-connected electromagnetic devices could be difficult to integrate into a single metallic barrier. Furthermore, a passive filter with a capacitor could be difficult to integrate into a single metallic barrier without also creating a break in the metallic barrier for a capacitor dielectric between two capacitor plates and such a break could allow for moisture ingress into the IC area 310.

In any case, as mentioned above, in the RFIC chip 300A, the single metallic barrier 325 can be physically separated from the IC area 310. This single metallic barrier 325 can further be electrically isolated from the IC area 310. For example, the RFIC chip 300A can be devoid of any interconnects between the single metallic barrier 325 and devices or other features within the IC area 310. Additionally, in order to ensure that the single metallic barrier 325 is not electrically connected to the IC area 310 through the substrate 301, the metallic barrier 325 can land on some form of isolation region within the edge portion 303 of the substrate 301. The isolation region 381 could be, for example, a doped well region or, alternatively, a moat region (i.e., a region protected during well implants) with a different conductivity type and/or level than the adjacent semiconductor material 383 between the isolation region 381 and the IC area 310. For example, the semiconductor substrate 301 could have a first type conductivity at a relatively low conductivity level (e.g., a P− substrate), the isolation region 381 could be a doped well region with a second type conductivity at a relatively high conductivity level (e.g., an N+ well region), and the adjacent semiconductor material 383 between the isolation region 381 and the IC area 310 could be another doped well region with the first-type conductivity at a higher conductivity level than the substrate (e.g., a P-well region). Alternatively, the isolation region 381 could be a conventional shallow trench isolation (STI) region (i.e., a trench that extends into the substrate 301 and that is filled with one or more layers of isolation material).

FIGS. 9A-9F illustrate in greater detail one exemplary embodiment of an RFIC chip 300B where the crackstop 320 includes multiple concentric metallic barrier (e.g., a first metallic barrier 325.1, also referred to herein as an inner metallic barrier, and a second metallic barrier 325.2, also referred to herein as an outer metallic barrier) and one or more passive filters including one or more electromagnetic devices embedded within the first metallic barrier 35.1 only. The passive filter(s) can be, for example, band pass filter(s) 390B configured according to the circuit diagram of FIG. 6A.

More specifically, FIG. 9A and FIGS. 9B-9D are a layout diagram and different cross-section diagrams, respectively, of an exemplary the RFIC chip 300B. This RFIC chip 300B can include a semiconductor substrate 301 and an IC area 310 on a center portion 302 of the semiconductor substrate 301. The IC area 310 can include, but is not limited to, a first device 311 (e.g., an RF device, such as an RF transistor, also referred to herein as an aggressor device) and a second device 312 (e.g., another RF device or some other non-RF device, also referred to herein as a victim device).

The RFIC chip 300B can further include a crackstop 320 on an edge portion of the semiconductor substrate 301. The crackstop 320 can include multiple concentric metallic barriers. The concentric metallic barriers can include a first metallic barrier 325.1 (i.e., an inner metallic barrier) that laterally surrounds and is physically separated from the IC area and a second metallic barrier 325.2 (i.e., an outer metallic barrier) that laterally surrounds and is physically separated from the first metallic barrier 325.1.

Each metallic barrier 325.1 and 325.2 can include an optional middle of the line (MOL) metal contact bar pattern 321, which extends vertically from the substrate 301 through dielectric material 326 to the lowest back end of the line (BEOL) metal level (i.e., to the $M_o$ level) and, on the metal contact bar pattern 321, a stack of alternating layers of metal via bar patterns 323 and metal wire patterns 322, which are within the interlayer dielectric (ILD) layers 335 of BEOL metal levels from the lowest to the highest BEOL metal levels (i.e., from the $M_o$ level to the $M_x$ level).

Generally, each metal pattern at each level of the first metallic barrier 325.1 (i.e., the optional metal contact bar pattern 321, the metal via bar patterns 323, and the metal wire patterns 322) encircles (i.e., laterally surrounds) the IC area 310. However, within the first metallic barrier 325.1, the metal patterns may or may not be fully continuous (due to the incorporation of electromagnetic device(s), as discussed in greater detail below). Each metal pattern at each level within the second metallic barrier 325.2 (i.e., the optional metal contact bar pattern 321, the metal via bar patterns 323, and the metal wire patterns 322) is continuous so that it completely encircles (i.e., completely laterally surrounds) the first metallic barrier 325.1.

Figure 9A:
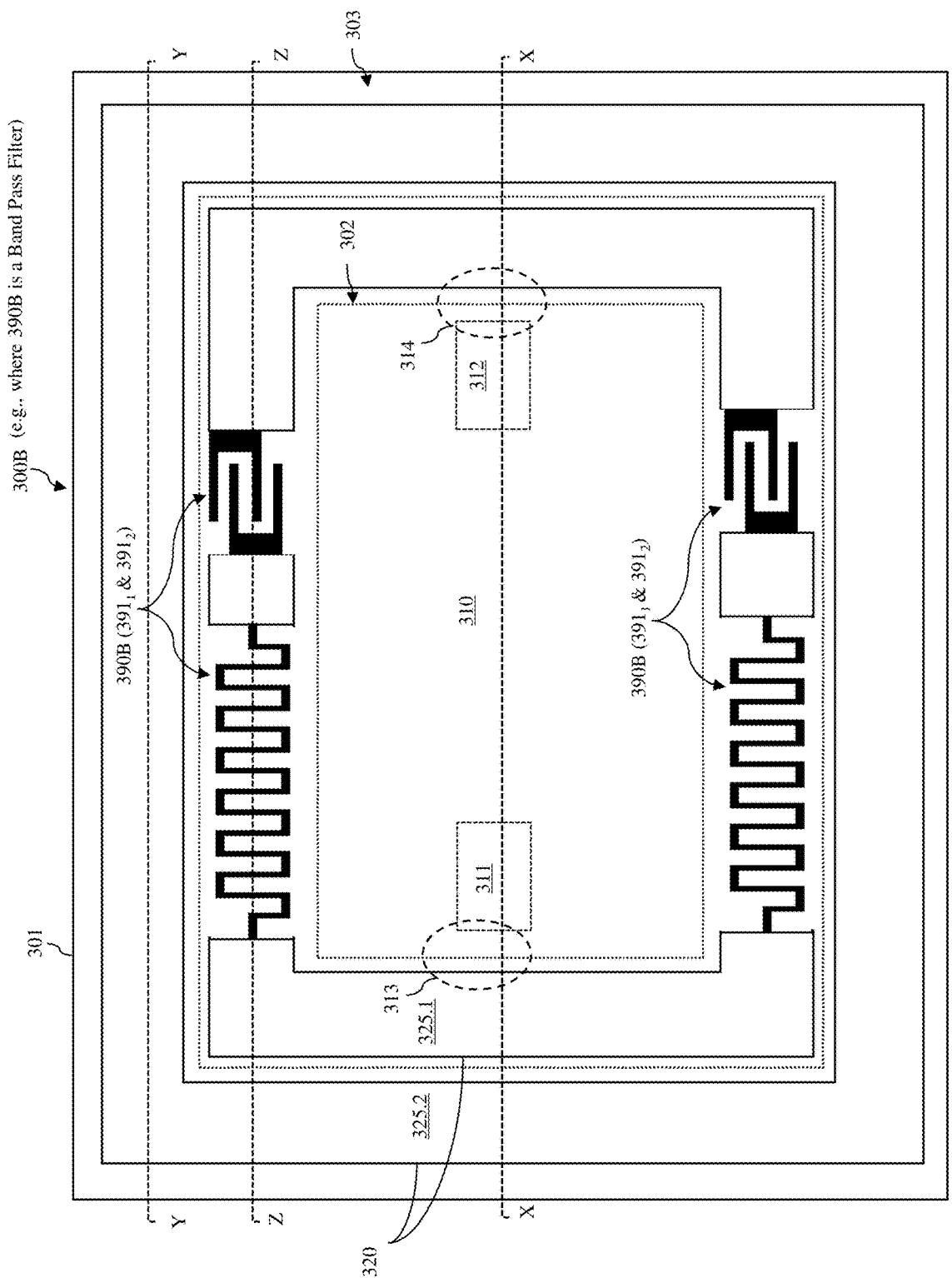
FIG. 9A is a layout diagram of an exemplary RFIC chip, such as that shown in FIG. 3B, where each embedded noise suppressor is specifically a band pass filter, such as that shown in FIG. 6A.
Figure 9B:
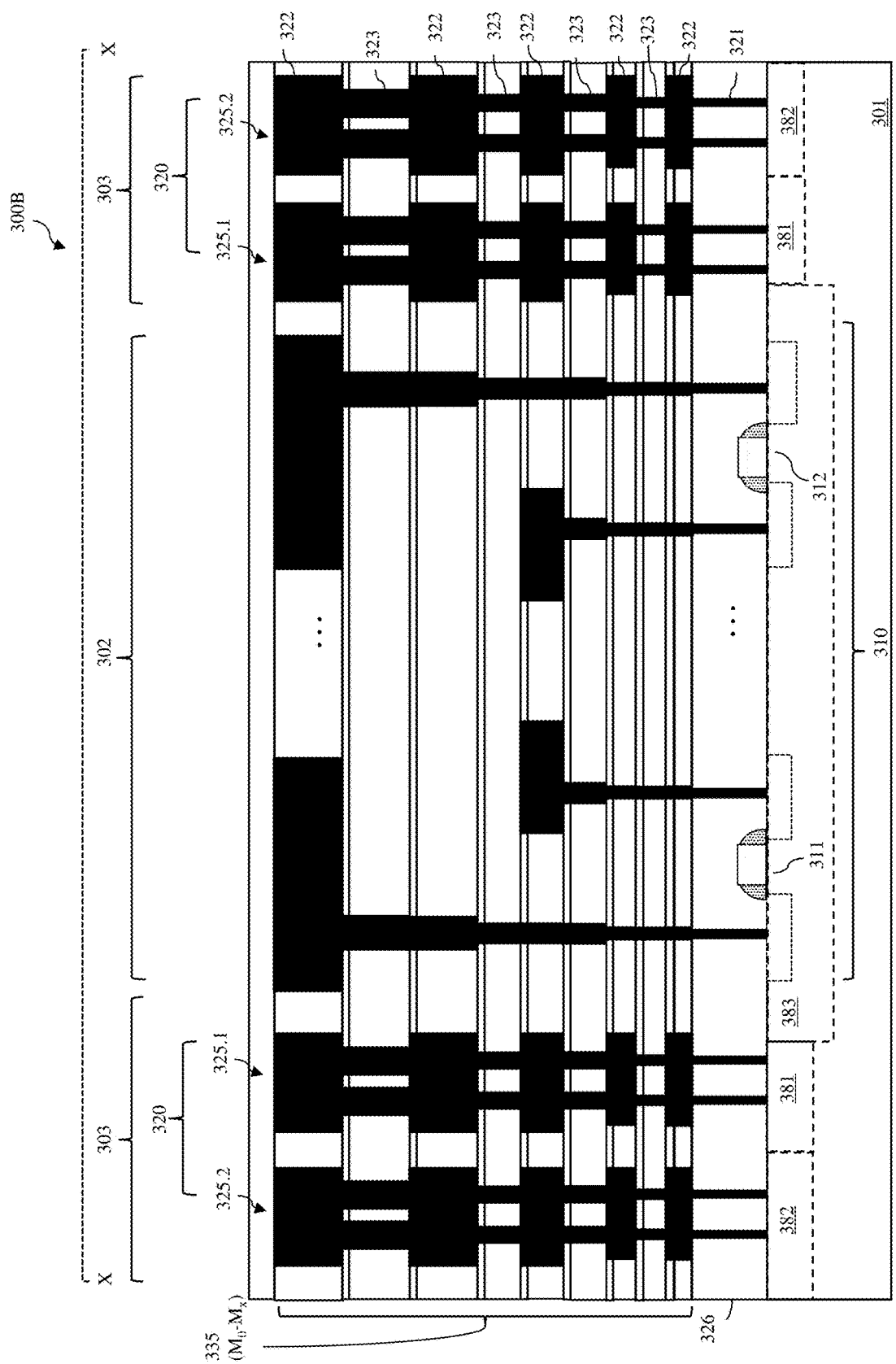
FIGS. 9B-9D are different cross-section views, respectively, of the RFIC chip of FIG. 9A.
Figure 9C:
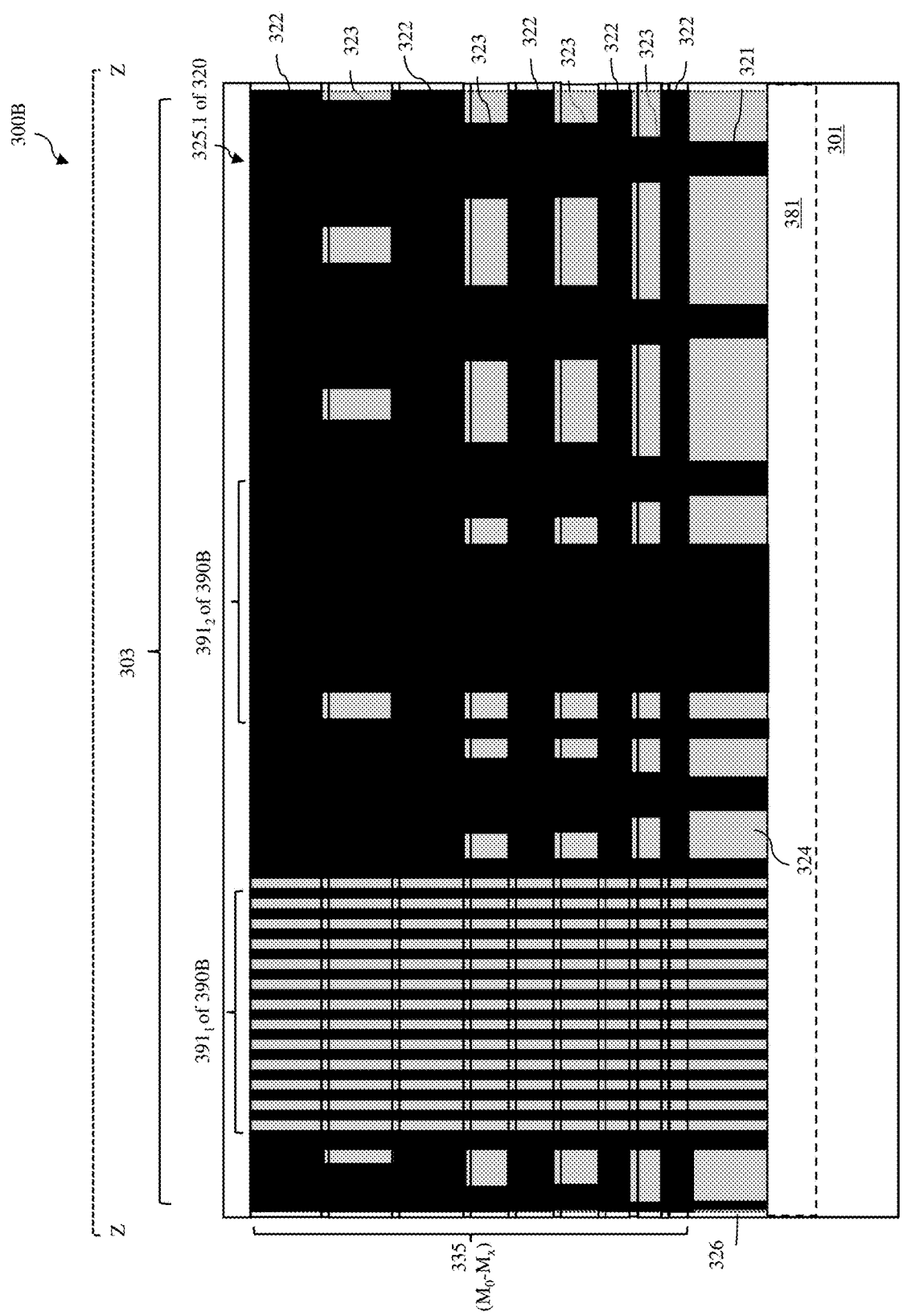
Figure 9D:
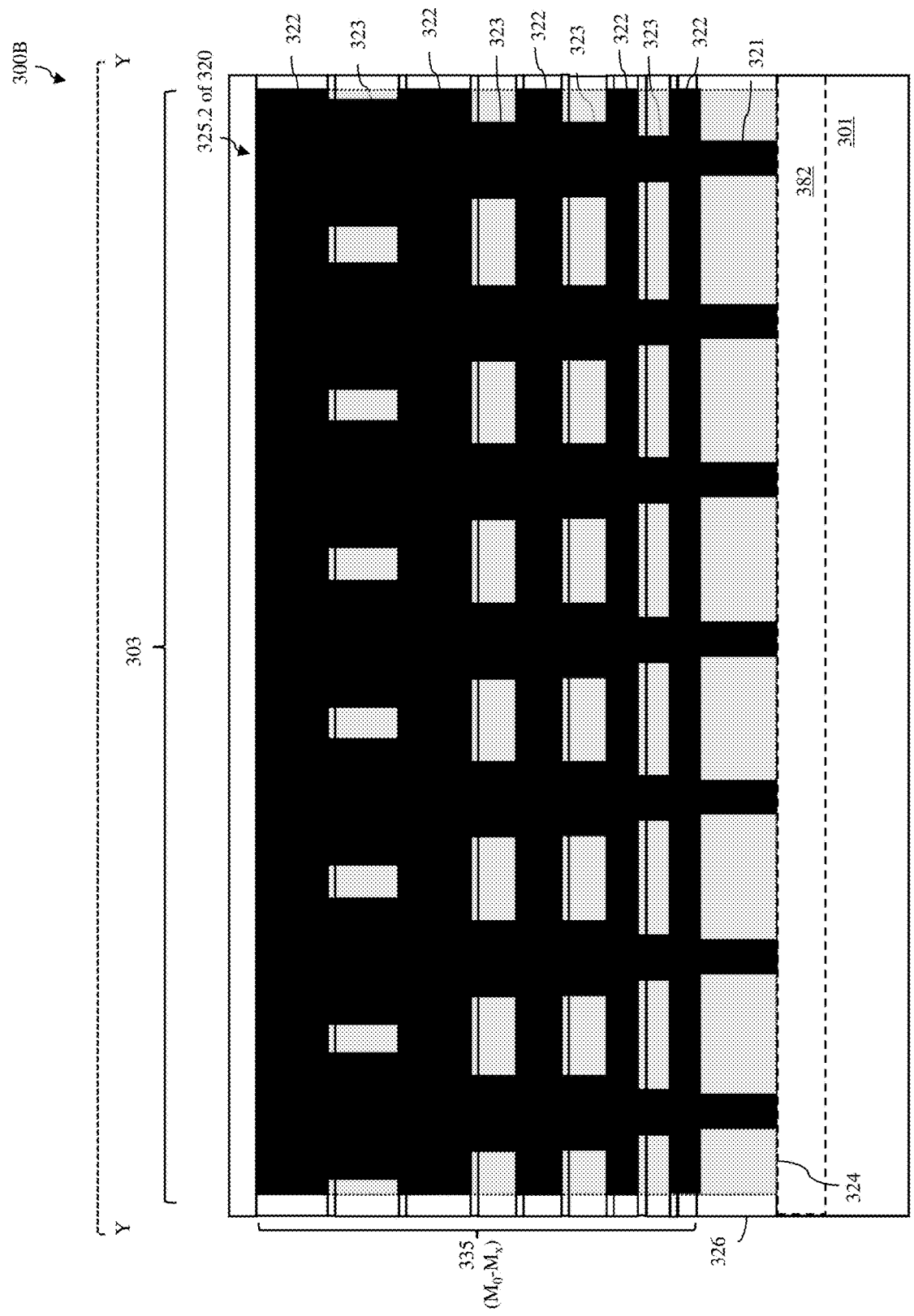
Figure 9E:
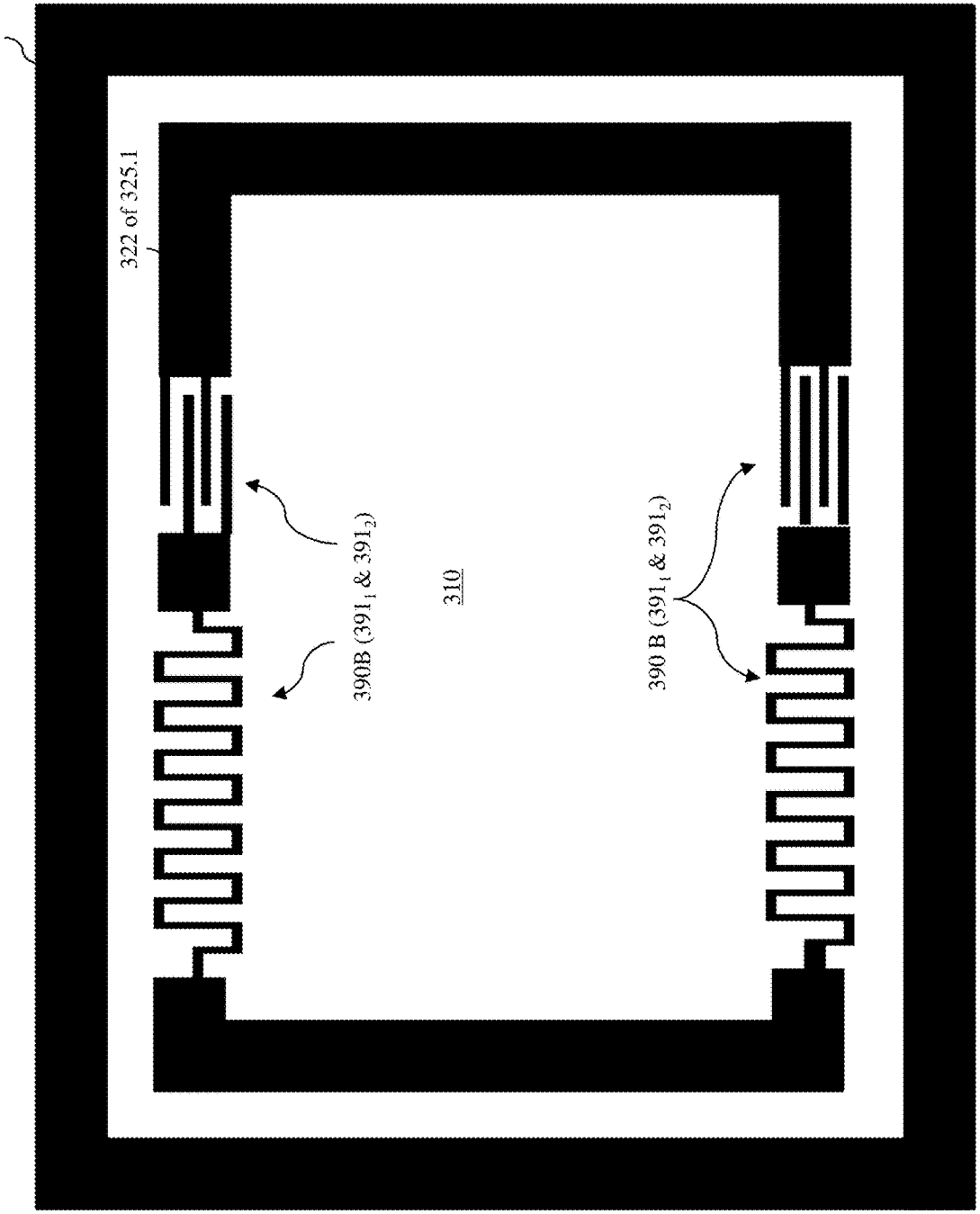
FIGS. 9E and 9F are exemplary layout diagrams of the metal wire pattern and the metal via bar pattern, respectively, within the crackstop of the RFIC chip of FIG. 9A.
Figure 9F:
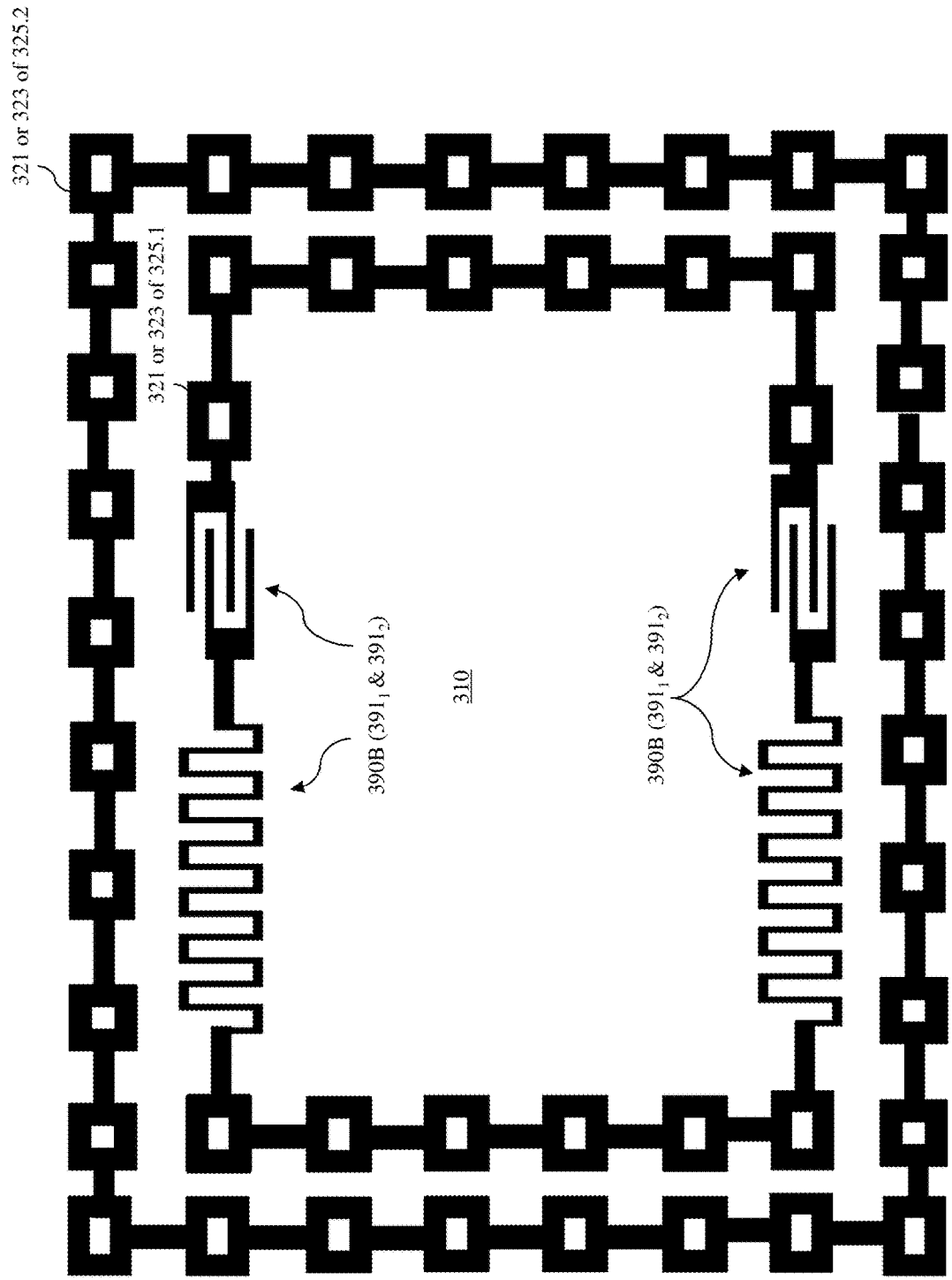

FIG. 9E shows an exemplary layout of the metal wire patterns 322 of the first and second metallic barriers 325.1 and 325.2 at any given level. These metal wire patterns include metal wires that are patterned and connected to create a first metal shape that encircles the IC area 310 and a second metal shape that encircles the first. For example, the metal wires within each metal wire pattern can include essentially linear wires that form the sides of a first metal rectangle around the IC area 310 and a second metal rectangle around the first. FIG. 9F shows an exemplary layout of the metal via bar patterns 323 of the first and second metallic barriers 325.1 and 325.2 at any given level. These metal via bar patterns include metal via bars that are patterned and connected to create essentially the same metal shapes as in the metal wire patterns. For purposes of illustration, the metal via bars within each metal via bar pattern are shown as being patterned into essentially linear metal chains that form the sides of a first metal rectangle around the IC area and a second metal rectangle around the first. FIGS. 9E-9F are provided for illustration purposes and are not intended to be limiting. Alternatively, the metal shapes at each level around the IC area can be different (e.g., circular, oval, etc.) and/or the pattern, particularly, of the metal via bars that form the sides of the metal shapes in the metal via bar patterns can vary. For example, the linear chains can have a more complex shape. The optional metal contact bar pattern 321 can have essentially the same layout as the metal via bar pattern or a different layout.

In addition to the features of the metal patterns described above, each metal pattern at each level of the first metallic barrier 325.1 in the crackstop 320 of the RFIC chip 300B can include at least one section that is specifically patterned into the shape(s) of the electromagnetic device(s) for at least one passive filter, as illustrated in FIGS. 9E-9F. For example, for each band pass filter 390B, each metal pattern at each level in the first metallic barrier 325.1 can include a section that is specifically patterned into the shapes of an inductor $391_1$ and the multi-finger capacitor plates of a capacitor $391_2$. From level-to-level, these sections that are patterned into the shape(s) of electromagnetic device(s) can be essentially the same and vertically aligned such that the resulting electromagnetic device(s) are embedded in the first metallic barrier 325.1 and further extend the full height of the first metallic barrier 325.1. For example, for a band pass filter 390B, from level-to-level, these sections that are patterned into the shapes of the inductor and the multi-finger capacitor plates of the capacitor can be essentially the same and vertically aligned such that the resulting inductor $391_1$ and capacitor $391_2$ are embedded in the first metallic barrier 325.1, extend the full height of the first metallic barrier 325.1, and are connected in series, as shown in FIG. 9C.

It should be noted that depending upon the configuration of the passive filter, including the types of electromagnetic device(s) and the connections between those devices, integration of the electromagnetic device(s) into the first metallic barrier 325.1 may result in the formation of dielectric-filled gaps that could allow for the ingress of moisture into the IC area 310. For example, in the band pass filter 390B described above and illustrated in the figures, the capacitor $391_2$, which is connected in series with the inductor $391_1$, includes multi-finger capacitor plates that are separated by a capacitor dielectric. The capacitor dielectric is effectively a break in the first metallic barrier 325.1 and it provides a potential path through which moisture could pass to the IC area. However, the second metallic barrier 325.2, which as mentioned above is continuous and completely encircles (i.e., completely laterally surrounds) the first metallic barrier 325.1, provides added protection against moisture ingress to the IC area 310.

In any case, the electromagnetic device(s) for the passive filter can be strategically placed along the first metallic barrier 325.1 between potential coupling areas 313-314 with the aggressor and victim devices 311-312. For example, in this case, the inductor $391_1$ and capacitor $391_2$ of each band pass filter 390B are placed between a first coupling area 313 (i.e., a coupling area between the crackstop 320 and the first device 311 at a first location within the IC area 310 near the perimeter) and a second coupling area 314 (e.g., a coupling area between the crackstop 320 and the second device 312 at a second location within the IC area 310 near the perimeter). Thus, each band pass filter 390B can be employed to ensure that, when any RF noise signals outside a some specific band (which does not include the specific RF range at which the RFIC chip operates) is emitted by the first device 311 and couples with the first metallic barrier 325.1 at the first coupling area 313, transmission of the RF noise through the first metallic barrier 325.1 to the second coupling area 314 is inhibited and, thus, interference with operation of the second device 312 is avoided.

The gray-shaded areas 324 in the cross-sections ZZ of FIG. 9C and YY of FIG. 9D are included to illustrate that, although in the cross-sections ZZ and YY there appear to be breaks in the metal contact bar pattern 321 and the metal via bar patterns 323, there is metal material fore and aft of these cross-sections, the first metallic barrier 325.1 is only broken at the capacitor dielectric of the capacitor $391_2$, and the second metallic barrier 325.2 is continuous.

As mentioned above, in the RFIC chip 300B, the first metallic barrier 325.1 laterally surrounds and is physically separated from the IC area 310 and the second metallic barrier 325.2 laterally surrounds and is physically separated from the first metallic barrier 325.1. Additionally, the first metallic barrier 325.1 and the second metallic barrier 325.2 can be electrically isolated from the IC area 310 and from each other. For example, the RFIC chip 300B can be devoid of any interconnects between the first metallic barrier 325.1 and devices or other features within the IC area 310 as well as between the first metallic barrier 325.1 and the second metallic barrier 325.2 Additionally, to avoid unwanted connections between the first metallic barrier, the second metallic barrier and/or the IC area 310 through the substrate 301, the metallic barriers 325.1 and 325.2 can land on some form of isolation region within the edge portion 303 of the substrate 301. For example, isolation regions 381-382 can be in the substrate 301 and aligned below the first and second metallic barriers 325.1-325.2, respectively. These isolation region 382 could be a doped well region. The isolation region 381 could be a doped well region or, alternatively, a moat region (i.e., a region protected during well implants). In either case, the isolation region 381 can have a different conductivity type than the isolation region 382 and can further have a different type conductivity and/or a different conductivity level than the adjacent semiconductor material 383 between the isolation region 381 and the IC area 310. For example, the semiconductor substrate 301 could have a first type conductivity at a relatively low conductivity level (e.g., a P− substrate) and the isolation region 382 could be a doped well region with a second type conductivity at a relatively high conductivity level (e.g., an N+ well region). In some embodiments, the isolation region 381 could be a doped well region with the first type conductivity at a relatively high level (e.g., a P+ well region) and the adjacent semiconductor material 383 between the isolation region 381 and the IC area 310 could have the second type conductivity. In other embodiments, the isolation region 381 could be a moat region with the first type conductivity at essentially the same level as the substrate (e.g., a P− moat region) and the adjacent semiconductor material 383 between the isolation region 381 and the IC area 310 could another doped well region with the first type conductivity at a conductivity level that is higher than the substrate 301 (e.g., a P-well). Alternatively, the first and second metallic barriers 325.1 and 325.2 can land on a conventional shallow trench isolation (STI) region (i.e., a trench that extends into the substrate 301 and that is filled with one or more layers of isolation material).

FIGS. 10A-10F illustrate in greater detail one exemplary embodiment of an RFIC chip 300C where the crackstop 320 includes multiple concentric metallic barrier (e.g., a first metallic barrier 325.1, also referred to herein as an inner metallic barrier, and a second metallic barrier 325.2, also referred to herein as an outer metallic barrier) and one or more passive filters with electromagnetic device(s) embedded in the first metallic barrier, in the second metallic barrier, in both metallic barriers and/or in the space between the metallic barriers. The passive filter(s) can be, for example, band stop filter(s) 390C configured according to the circuit diagram of FIG. 7D.

More specifically, FIG. 10A and FIGS. 10B-10D are a layout diagram and different cross-section diagrams, respectively, of an exemplary the RFIC chip 300C. This RFIC chip 300C can include a semiconductor substrate 301 and an IC area 310 on a center portion 302 of the semiconductor substrate 301. The IC area 310 can include, but is not limited to, a first device 311 (e.g., an RF device, such as an RF transistor, also referred to herein as an aggressor device) and a second device 312 (e.g., another RF device or some other non-RF device, also referred to herein as a victim device).

The RFIC chip 300C can further include a crackstop 320 on an edge portion of the semiconductor substrate 301. The crackstop 320 can include multiple concentric metallic barriers. The concentric metallic barriers can include a first metallic barrier 325.1 (i.e., an inner metallic barrier) that laterally surrounds and is physically separated from the IC area and a second metallic barrier 325.2 (i.e., an outer metallic barrier) that laterally surrounds the first metallic barrier 325.1.

Each metallic barrier 325.1 and 325.2 can include an optional middle of the line (MOL) metal contact bar pattern 321, which extends vertically from the substrate 301 through dielectric material 326 to the lowest back end of the line (BEOL) metal level (i.e., to the $M_o$ level) and, on the metal contact bar pattern 321, a stack of alternating layers of metal via bar patterns 323 and metal wire patterns 322, which are within the interlayer dielectric (ILD) layers 335 of BEOL metal levels from the lowest to the highest BEOL metal levels (i.e., from the $M_o$ level to the $M_x$ level).

Generally, each metal pattern at each level of the first metallic barrier 325.1 (i.e., the optional metal contact bar pattern 321, the metal via bar patterns 323, and the metal wire patterns 322) encircles (i.e., laterally surrounds) the IC area 310. However, within the first metallic barrier 325.1, the metal patterns may or may not be fully continuous (due to the incorporation of electromagnetic device(s), as discussed in greater detail below). Each metal pattern at each level within the second metallic barrier 325.2 (i.e., the optional metal contact bar pattern 321, the metal via bar patterns 323, and the metal wire patterns 322) is continuous so that it completely encircles (i.e., completely laterally surrounds) the first metallic barrier 325.1.

Figure 10A:
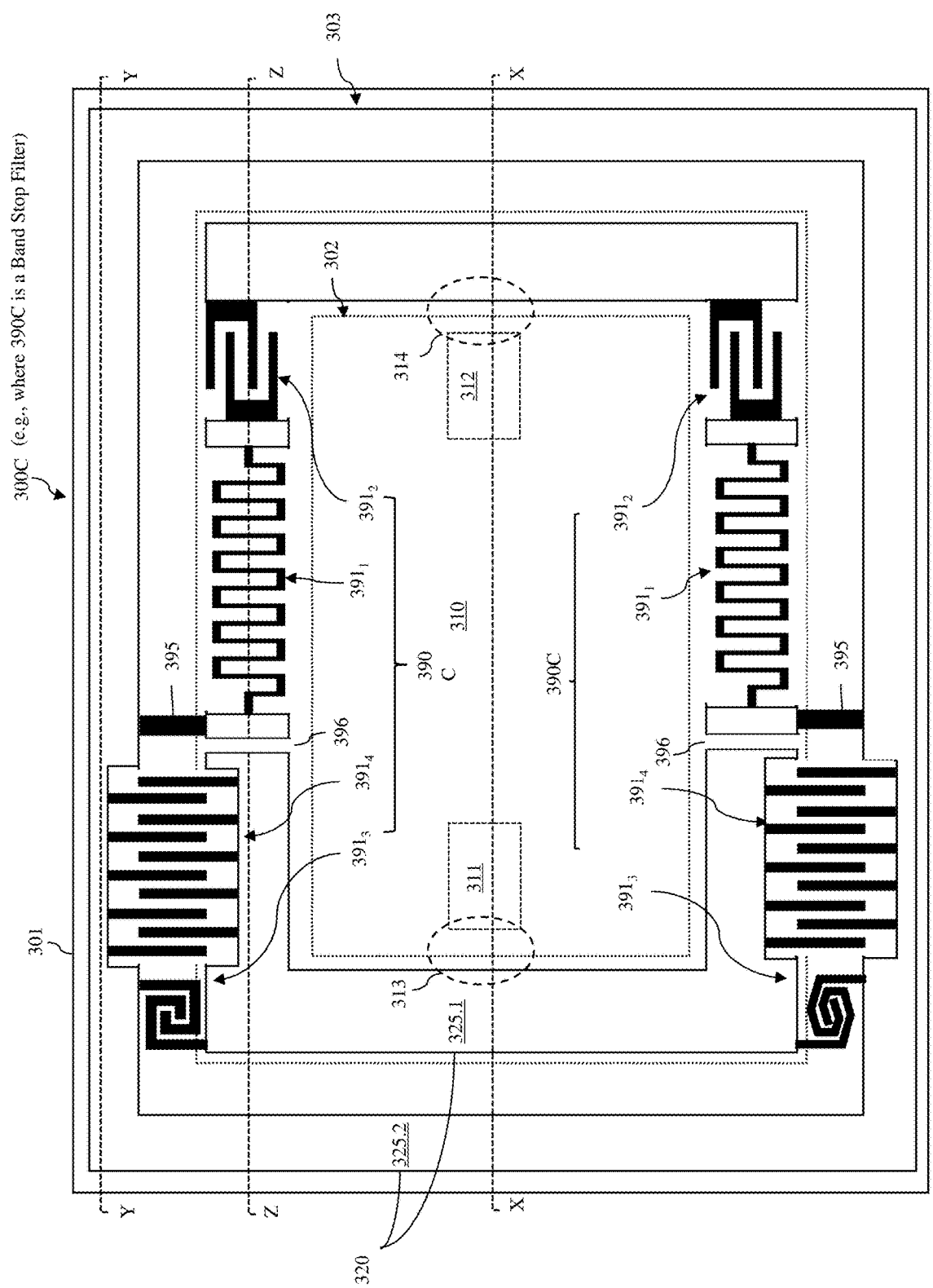
FIG. 10A is a layout diagram of an exemplary RFIC chip, such as that shown in FIG. 3C, where each embedded noise suppressor is specifically a band stop filter, such as that shown in FIG. 7D.
Figure 10B:
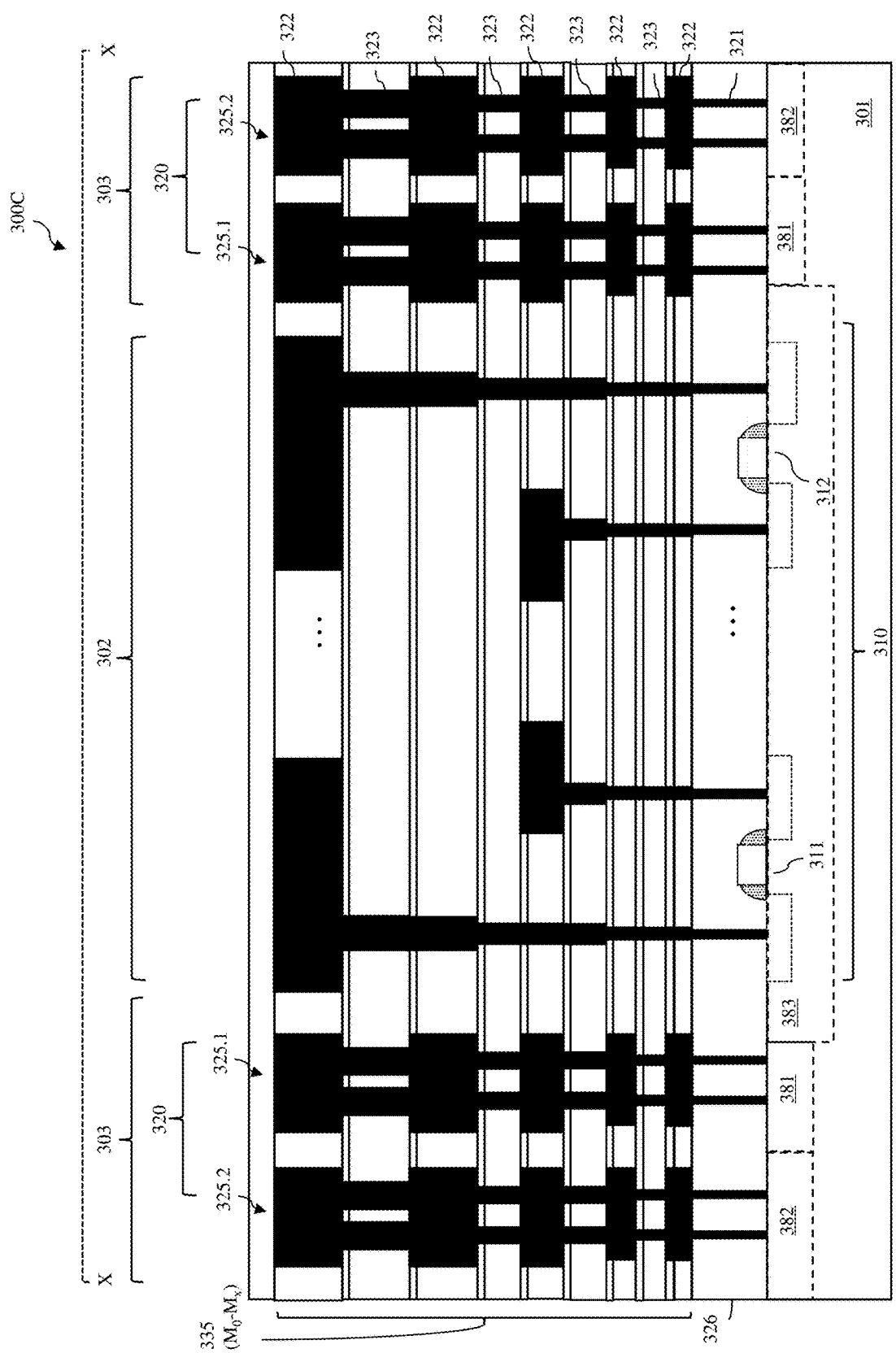
FIGS. 10B-10D are different cross-section views, respectively, of the RFIC chip of FIG. 10A.
Figure 10C:
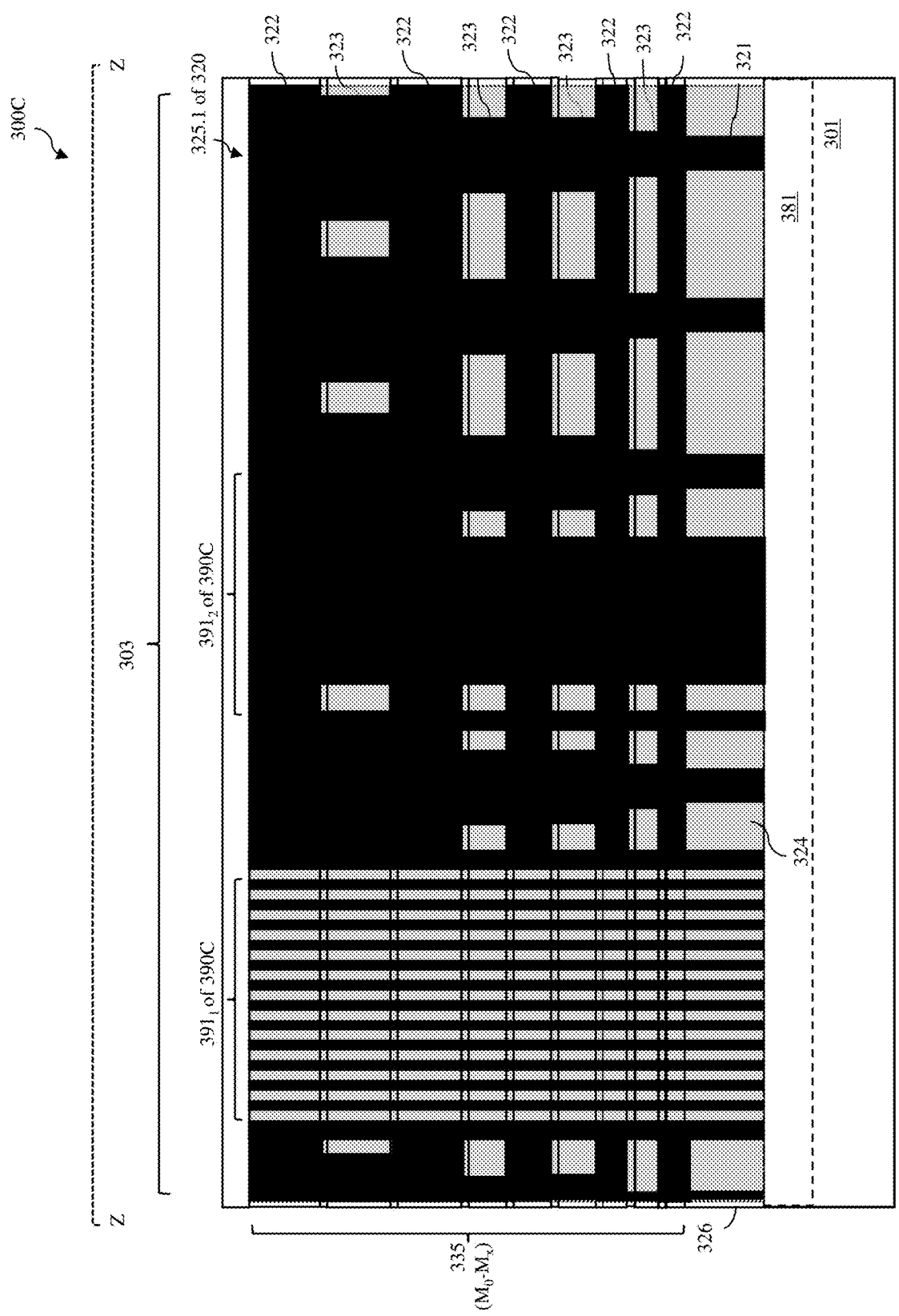
Figure 10D:
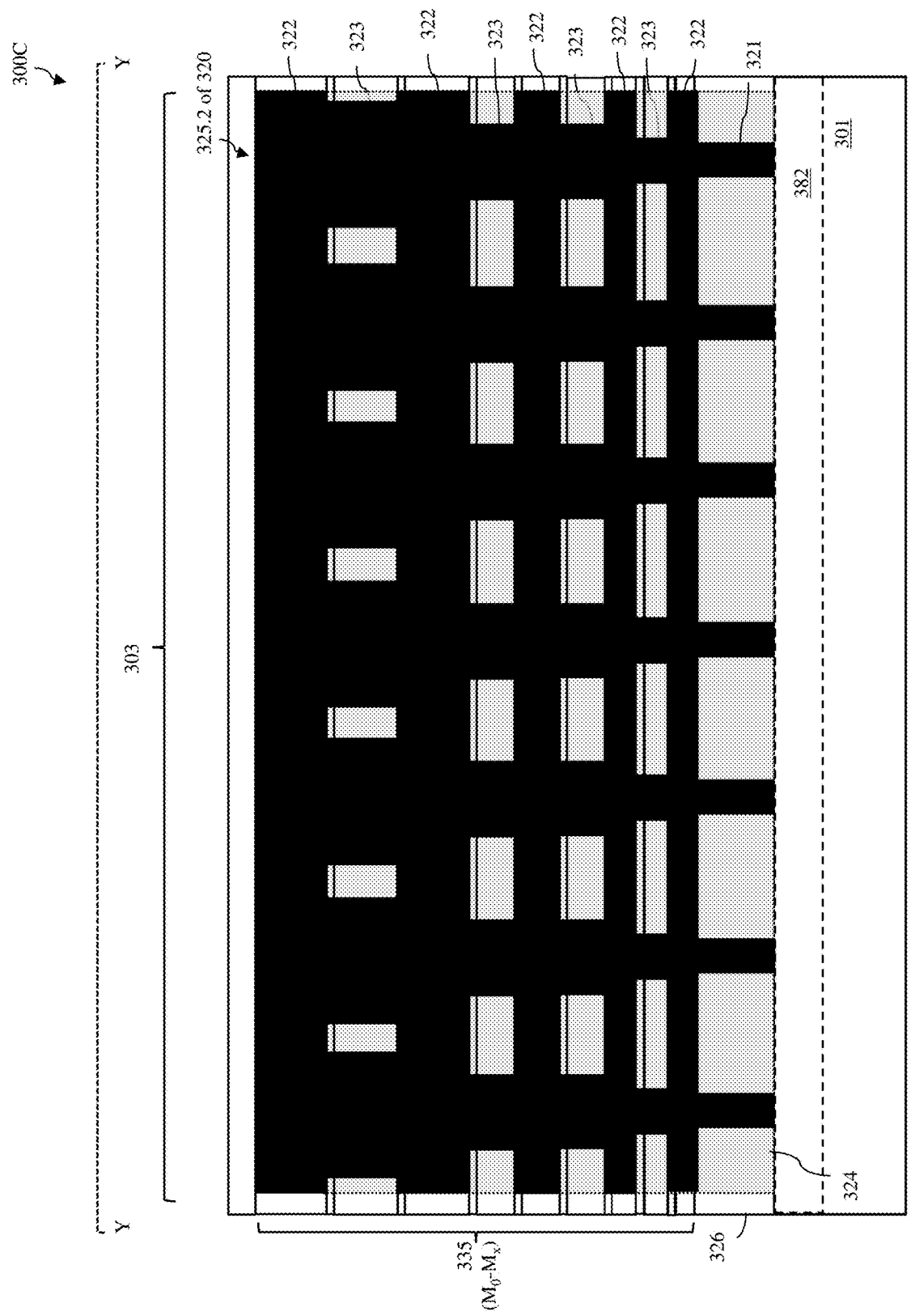
Figure 10E:
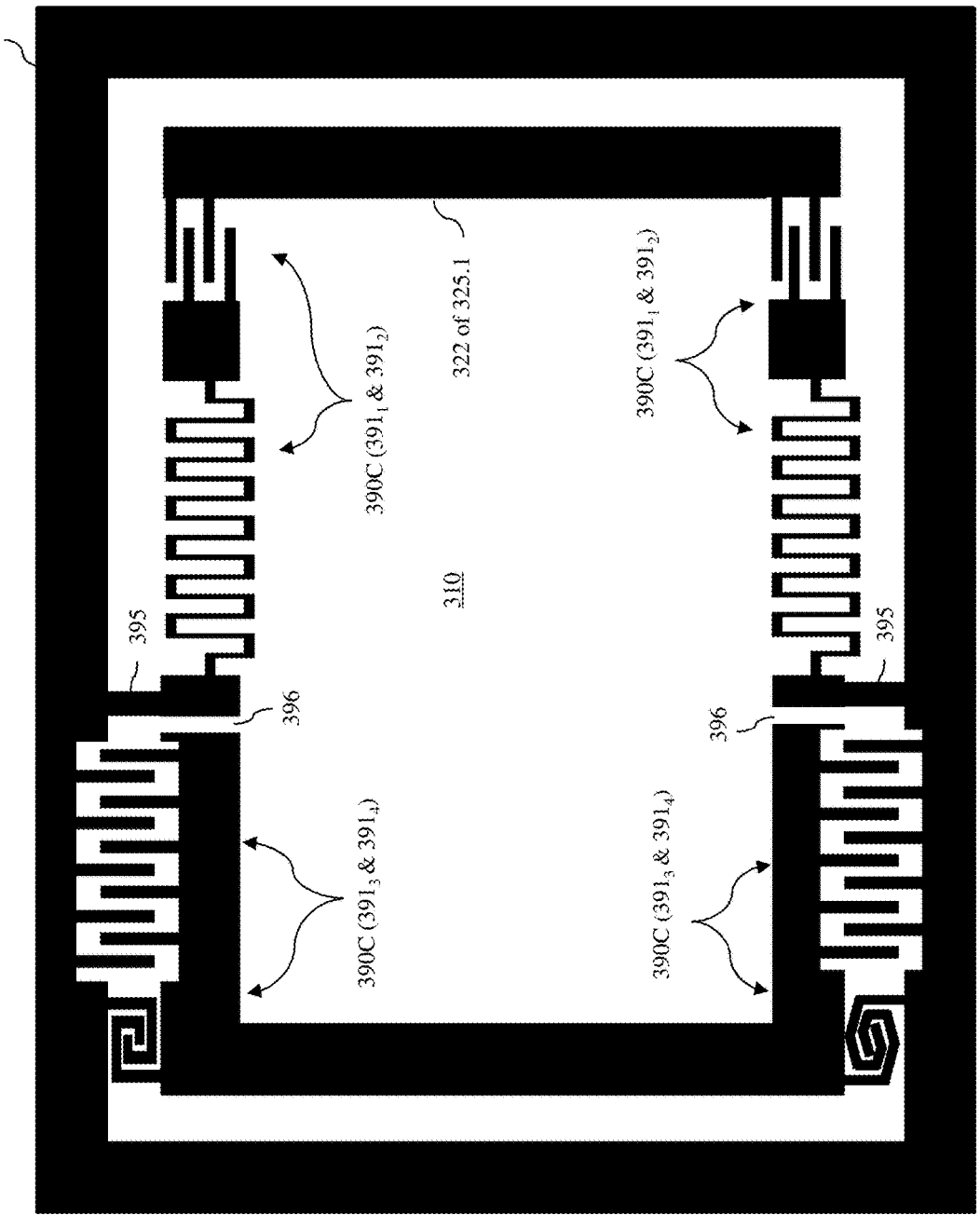
FIGS. 10E and 10F are exemplary layout diagrams of the metal wire pattern and the metal via bar pattern, respectively, within the crackstop of the RFIC chip of FIG. 10A.
Figure 10F:
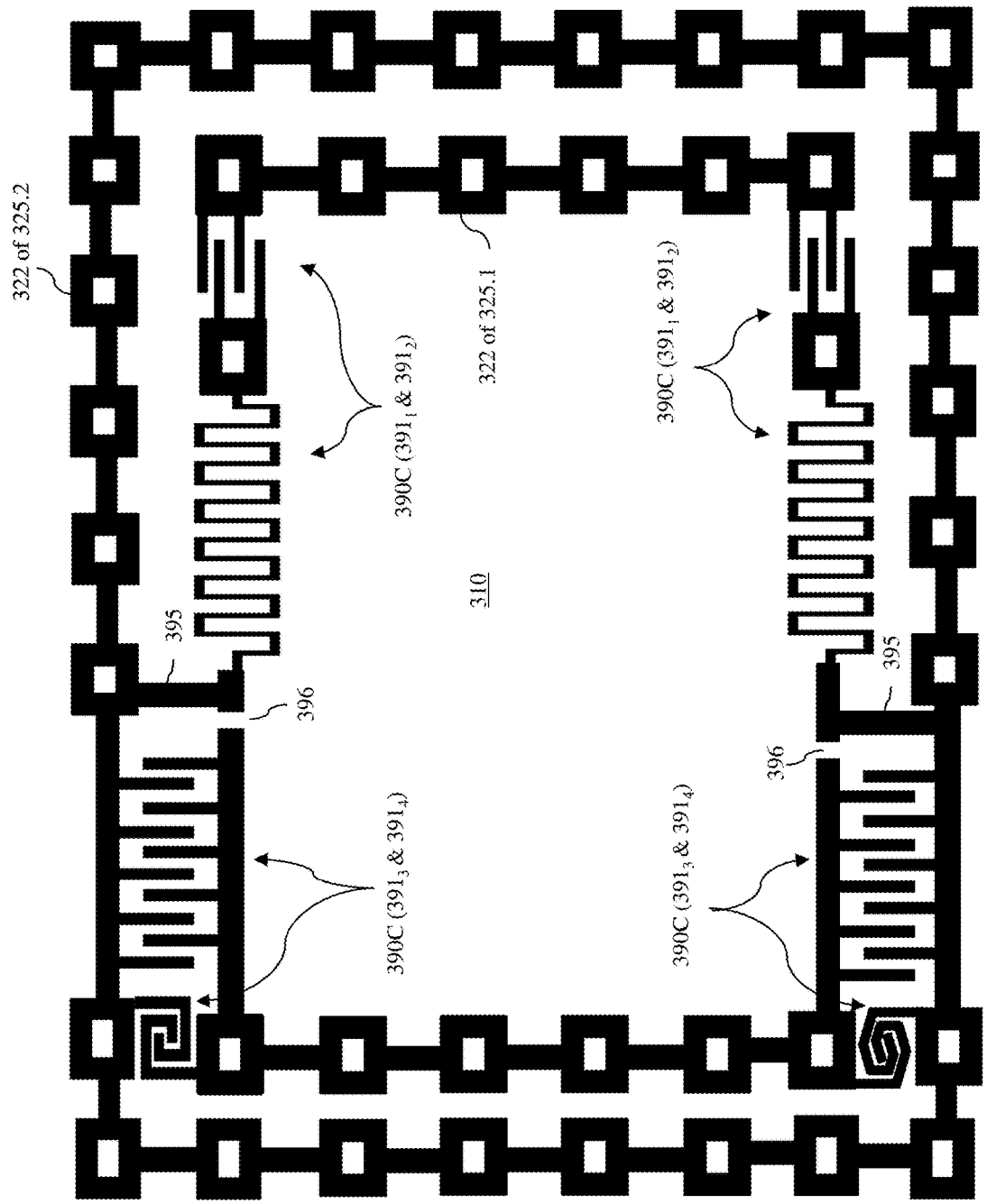

FIG. 10E shows an exemplary layout of the metal wire patterns 322 of the first and second metallic barriers 325.1 and 325.2 at any given level. These metal wire patterns include metal wires that are patterned and connected to create a first metal shape that encircles the IC area 310 and a second metal shape that encircles the first. For example, the metal wires within each metal wire pattern can include essentially linear wires that form the sides of a first metal rectangle around the IC area 310 and a second metal rectangle around the first. FIG. 10F shows an exemplary layout of the metal via bar patterns 323 of the first and second metallic barriers 325.1 and 325.2 at any given level. These metal via bar patterns include metal via bars that are patterned and connected to create essentially the same metal shapes as in the metal wire patterns. For purposes of illustration, the metal via bars within each metal via bar pattern are shown as being patterned into essentially linear metal chains that form the sides of a first metal rectangle around the IC area and a second metal rectangle around the first. FIGS. 10E-10F are provided for illustration purposes and are not intended to be limiting. Alternatively, the metal shapes at each level around the IC area can be different (e.g., circular, oval, etc.) and/or the pattern, particularly, of the metal via bars that form the sides of the metal shapes in the metal via bar patterns can vary. For example, the linear metal chains can have a more complex shape. The optional metal contact bar pattern 321 can have essentially the same layout as the metal via bar pattern or a different layout.

In addition to the features of the metal patterns described above, the metal patterns can include sections within the first metallic barrier, within the second metallic barrier, within a combination of the first and second metallic barriers and/or within the space between the metallic barriers for at least one passive filter. For example, for a band stop filter 390C, each metal pattern at each level of the first metallic barrier 325.1 in the crackstop 320 of the RFIC chip 300C can include a section that is specifically patterned into the shapes of a first inductor and multi-finger capacitor plates of a first capacitor. From level-to-level, these sections that are patterned into the shapes of the first inductor and the multi-finger capacitor plates of the first capacitor can be essentially the same and vertically aligned such that the resulting first inductor $391_1$ and first capacitor $391_2$ are embedded in the first metallic barrier 325.1, extend the full height of the first metallic barrier 325.1, and are connected in series, as shown in FIG. 10C. Additionally, for a band stop filter 390C, each metal pattern at each level of the first and second metallic barriers 325.1-325.2 can include sections that are specifically patterned into the shapes of multi-finger capacitor plates of a second capacitor, respectively. From level-to-level, these sections that are patterned into the shapes of the multi-finger capacitor plates for the second capacitor can be essentially the same and vertically aligned such that the resulting second capacitor $391_4$ has capacitor plates embedded in the metallic barriers 325.1-325.2, facing each other, and extending the full height of the metallic barriers 325.1-325.2. Furthermore, for a band stop filter 390C, the metal pattern at one or more of the levels can include section(s) specifically patterned into the shape of a second inductor $391_3$ with end terminals connected to the first and second metallic barriers, respectively, such that second inductor $391_3$ and second capacitor $391_4$ are connected in parallel. It should be noted that as long as only the end terminals of the second inductor are connected to the metallic barriers, the inductor does not need to extend the full height of the metallic barriers.

In this embodiment, interconnects 395 and/or breaks 396 in the metallic barrier(s) may be required to create the desired passive circuit (e.g., to properly connect the parallel-connected second inductor and second capacitor to the series connected first inductor and first capacitor).

It should be noted that depending upon the configuration of the passive filter, including the types of electromagnetic device(s) and the connections between those devices, integration of the electromagnetic device(s) into the metallic barriers 325 may result in the formation of dielectric-filled gaps that could allow for the ingress of moisture into the IC area 310. Care should be taken during design to ensure that such gaps are not formed in the second metallic barrier 325.2 so as to ensure that the second metallic barrier 325.2 completely encircles (i.e., completely laterally surrounds) the first metallic barrier 325.1 and provides added protection against moisture ingress to the IC area 310.

In any case, the electromagnetic device(s) for the passive filter can be strategically placed along and/or between the first and second metallic barrier 325.1-325 so as to be between potential coupling areas 313-314 with the aggressor and victim devices 311-312. For example, in this case, the electromagnetic devices $391_1$-$391_4$ of the band stop filter 390C are placed between a first coupling area 313 (i.e., a coupling area between the crackstop 320 and the first device 311 at a first location within the IC area 310 near the perimeter) and a second coupling area 314 (e.g., a coupling area between the crackstop 320 and the second device 312 at a second location within the IC area 310 near the perimeter). Thus, each band stop filter 390C can be employed to ensure that, when any RF noise signals within some specific band (which includes the specific RF range at which the RFIC chip operates) is emitted by the first device 311 and couples with the first metallic barrier 325.1 at the first coupling area 313, transmission of the RF noise through the first metallic barrier 325.1 to the second coupling area 314 is inhibited and, thus, interference with operation of the second device 312 is avoided.

As in the figures for the previously described embodiments, the gray-shaded areas 324 in the cross-sections ZZ of FIG. 10C and YY of FIG. 10D are included to illustrate that, although in the cross-sections ZZ and YY there appear to be breaks in the metal contact bar pattern 321 and the metal via bar patterns 323, there is metal material fore and aft of these cross-sections with the first metallic barrier 325.1 only being broken at the capacitor dielectric of the first capacitor $391_2$ and at any required breaks 396 and with the second metallic barrier 325.2 being continuous.

As mentioned above, in the RFIC chip 300C, the first metallic barrier 325.1 laterally surrounds and is physically separated from the IC area 310 and the second metallic barrier 325.2 laterally surrounds the first metallic barrier 325.1. While the first and second metallic barriers 325.1-325.2 may be electrically connected to each other in order to create a particular passive circuit (e.g., a band stop circuit), they are electrically isolated from the IC area 310. That is, the RFIC chip 300C can be devoid of any interconnects between the first and/or second metallic barriers 325.1-325.2 and devices or other features within the IC area 310. Additionally, to avoid unwanted connections between the first metallic barrier, the second metallic barrier and/or the IC area 310 through the substrate 301, the metallic barriers 325.1 and 325.2 can land on some form of isolation region within the edge portion 303 of the substrate 301. For example, isolation regions 381-382 can be in the substrate 301 and aligned below the first and second metallic barriers 325.1-325.2, respectively. These isolation region 382 could be a doped well region. The isolation region 381 could be a doped well region or, alternatively, a moat region (i.e., a region protected during well implants). In either case, the isolation region 381 can have a different conductivity type than the isolation region 382 and can further have a different type conductivity and/or a different conductivity level than the adjacent semiconductor material 383 between the isolation region 381 and the IC area 310. For example, the semiconductor substrate 301 could have a first type conductivity at a relatively low conductivity level (e.g., a P− substrate) and the isolation region 382 could be a doped well region with a second type conductivity at a relatively high conductivity level (e.g., an N+ well region). In some embodiments, the isolation region 381 could be a doped well region with the first type conductivity at a relatively high level (e.g., a P+ well region) and the adjacent semiconductor material 383 between the isolation region 381 and the IC area 310 could have the second type conductivity. In other embodiments, the isolation region 381 could be a moat region with the first type conductivity at essentially the same level as the substrate (e.g., a P− moat region) and the adjacent semiconductor material 383 between the isolation region 381 and the IC area 310 could another doped well region with the first type conductivity at a conductivity level that is higher than the substrate 301 (e.g., a P-well). Alternatively, the first and second metallic barriers 325.1 and 325.2 can land on a conventional shallow trench isolation (STI) region (i.e., a trench that extends into the substrate 301 and that is filled with one or more layers of isolation material).

Figure 11:
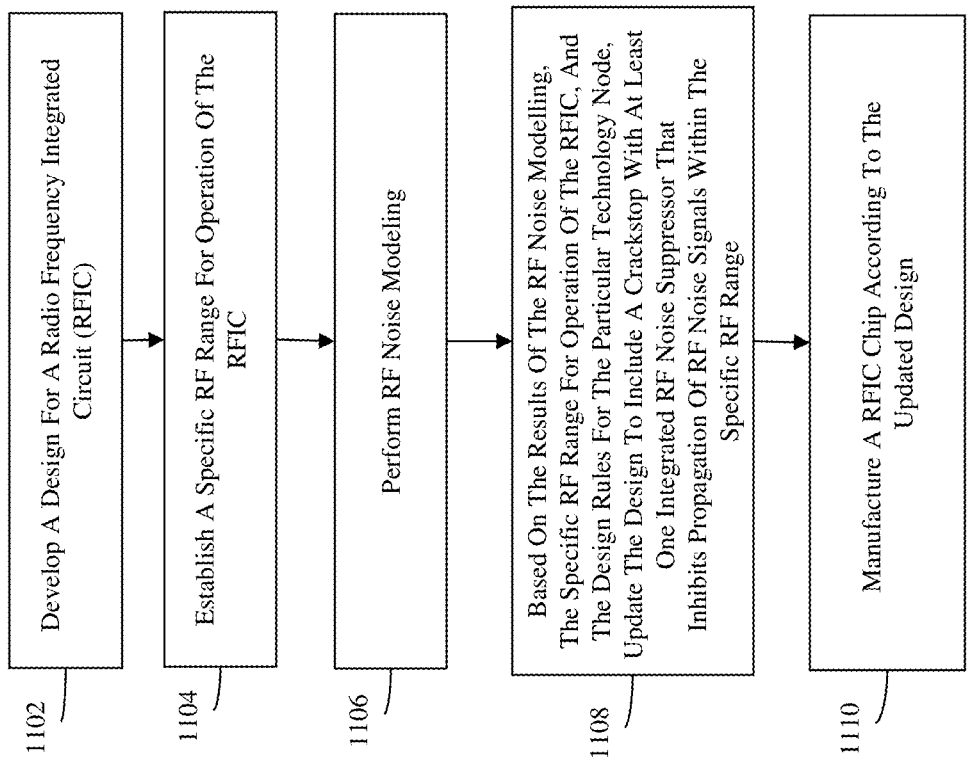
FIG. 11 is a flow diagram illustrating embodiments of a method of designing and manufacturing an RFIC chip with a crackstop having one or more embedded noise suppressors.

Referring to the flow diagram of FIG. 11, also disclosed herein are embodiments of a method of designing and manufacturing a radio frequency integrated circuit (RFIC) chip with a crackstop having one or more embedded noise suppressors (also referred to herein as noise dampeners).

More specifically, the method embodiments can include developing a design for an RFIC chip (see process step 1102). An RFIC is an IC with devices and circuitry configured to operate at frequencies within the radio spectrum. The radio spectrum includes RF signals with frequencies ranging from 3 Hz to 3 THz. RFIC applications include, but are not limited to, wireless communication applications (e.g., mobile phones, Wi-Fi devices, Bluetooth devices, satellite transceivers, etc.), radar system applications, military applications, imaging applications, etc. $4^{th}$ generation (4G) RFIC applications operate at or below 6 GHz. Developing $5^{th}$ generation (5G) RFIC applications are being designed to operate in an ultra-wide band (UWB), which includes the same sub-6 GHz band previously covered by 4G applications and a lower portion of the millimeter wave band (mmWave band) (e.g., 24 GHz to 100 GHz). Those skilled in the art will recognize that the mmWave band is a sub-band within the radio spectrum and includes RF signals with extremely high frequencies ranging from 24 GHz to 300 GHz. The wavelengths of the RF signals within this mmWave band range from 1 mm at 300 GHz to 10 mm at 30 GHz (hence the name).

The method embodiments can further include establishing a specific radio frequency (RF) range for operation of the RFIC chip (see process step 1104). The specific RF range can be established based on the particular application and further based on customer-specified operating parameters.

The method embodiments can further include performing RF noise modeling based on the design (see process step 1106). For example, the design for the RFIC chip can include the layout of devices to be formed with an IC area of the RFIC chip. The RF noise modeling can include modelling potential noise coupling of a crackstop, which will surround the IC area, with any RF devices that are located within the IC area near the perimeter. Such RF noise modeling can include identification of any aggressor-victim device pairs. That is, the RF noise modeling can indicate when coupling between the crackstop and an RF signal, which is within the specific RF range and which is emitted by a first device and, particularly, an RF device (also referred to herein as an aggressor device) will interfere with operation of a second device (e.g., either another RF device or some non-RF device, also referred to herein as a victim device) because that RF signal will be propagated along the crackstop and couple with the second device. Various techniques for performing RF noise modeling are well known in the art and, thus, the details of these techniques have been omitted from the specification in order to allow the reader to focus on the salient aspects of the disclosed methods.

The method embodiments can further include updating the design for the RFIC chip to include a crackstop that has one or more embedded noise suppressors (see process step 1108). Updating the design for the RFIC chip at process step 1108 can include selecting a basic crackstop configuration from amongst several possible configurations including, for example: a crackstop that includes a single metallic barrier with at least one passive filter having one or more electromagnetic devices integrated therein, as in the RFIC chip 300A; a crackstop that includes multiple concentric metallic barriers with at least one passive filter having one or more electromagnetic devices integrated into the first metallic barrier only, as in the RFIC chip 300B; or a crackstop that includes multiple concentric metallic barriers with at least one passive filter having one or more electromagnetic devices integrated into the first metallic barrier, the second metallic barrier, both the first metallic barrier and the second metallic barrier, and/or the space between the first metallic barrier and the second metallic barrier, as in the RFIC chip 300C.

Updating the design for the RFIC chip at process step 1108 can further include selecting the particular filter circuit structure for each specific passive filter to be included in the crackstop. That is, as discussed above with regard to the structure embodiments, a passive filter can include one or more electromagnetic devices (e.g., resistor(s), inductor(s), capacitor(s) and/or stub(s)), which is/are connected (e.g., in series and/or in parallel) along a single path between aggressor and victim descries such that the passive filter functions as a low pass filter (e.g., see the different exemplary low pass filters shown in the circuit diagrams of FIGS. 4A-4D), a high pass filter (e.g., see the different exemplary high pass filters shown in the circuit diagrams of FIGS. 5A-5D), a band pass filter (e.g., see the different exemplary band pass filters shown in FIGS. 6A-6C), or a band stop filter (e.g., see the different exemplary band stop filters shown in FIGS. 7A-7D). Any of the passive filters described above and illustrated in FIGS. 4A-7D or any other suitable passive filter could be selected for inclusion in the crackstop.

Once the specific passive filter is selected, it can be customized to inhibit RF noise signal propagation within the specific RF range. That is, given a specific RF range, a passive filter calculator can be employed to determine the required specifications for the electromagnetic device(s) (e.g., inductance(s) of inductor(s), resistance(s) of resistor(s), capacitance(s) of capacitor(s), etc., as applicable) of the specific passive filter in order to achieve the desired results. In the case of a low pass filter, the desired results can include propagation of only those RF signals that are below a certain frequency that is lower than the minimum frequency of the specific RF range such that propagation of RF noise signals within the specific RF range is inhibited. In the case of a high pass filter, the desired results can include propagation of only those RF signals that are above a certain frequency that is higher than the maximum frequency of the specific RF range such that propagation of RF noise signals within the specific RF range is inhibited. In the case of a band pass filter, the desired results can include propagation of only those RF signals that are within a certain band that does not include the specific RF range such that propagation of RF noise signals within the specific RF range is inhibited. Finally, in the case of a band stop filter, the desired results can include propagation of only those RF signals that are outside a certain band that includes the specific RF range such that propagation of RF noise signals within the specific RF range is inhibited.

Filter calculators, including low pass filter calculators, high pass filter calculators, band pass filter calculators and band stop filter calculators, are well known in the art. Thus, the details of such calculators have been omitted from this specification in order to allow the reader to focus on the salient aspects of the disclosed embodiments. However, it should be understood that the calculations used to determine the specifications of the electromagnetic devices will vary depending upon the specific passive filter circuit selected.

For example, for the exemplary band pass filter employed in the crackstop 320 in the RFIC chip 300B and illustrated in the circuit diagram of FIG. 6A, the following equation can be employed to determine the required inductance (L) of the inductor and the required capacitance (C) of the capacitor given the minimum frequency of the specific RF range (also referred to as the cut-off frequency ($f_L$)):

$$f_L = \frac{1}{2\Pi\sqrt{LC}}.$$

Figure 7A:
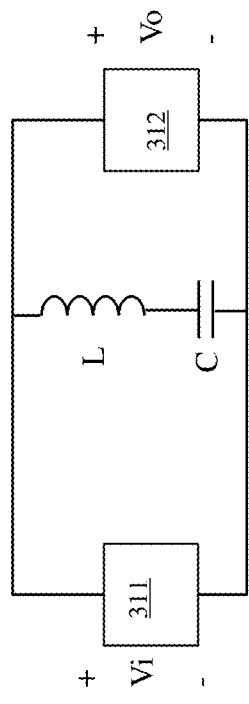
FIGS. 7A-7D are circuit diagrams illustrating exemplary band stop filters that could be embedded into a crackstop.
Figure 7B:
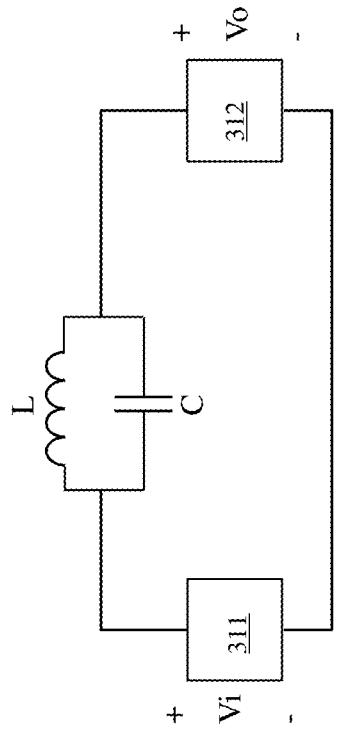
Figure 7C:
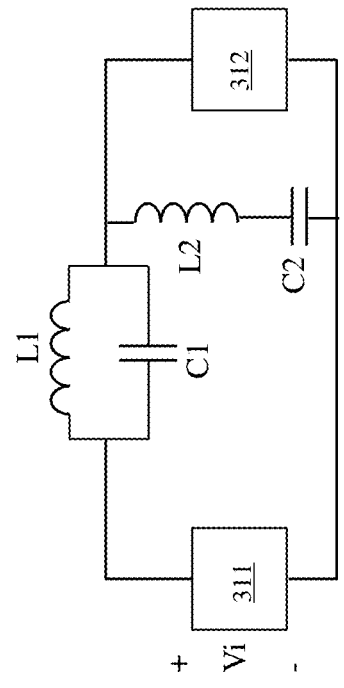
Figure 7D:
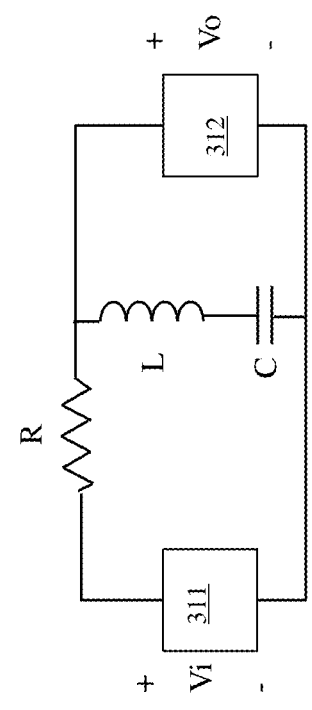

For the exemplary band stop filter employed in the crackstop 320 in the RFIC chip 300C and illustrated in the circuit diagram of FIG. 7D, the following equations can be employed to determine the required inductances (L1 and L2) of the first and second inductors and to further determine the required capacitances (C1 and C2) for the first and second capacitors given the minimum frequency of the specific RF range (also referred to as the low cut-off frequency ($f_L$) and further given the maximum frequency of the specific RF range (also referred to has the high cut-off frequency ($f_H$):

$$Z = R_0 = \sqrt{\frac{L_1}{C_2}} = \sqrt{\frac{L_2}{C_1}},$$

$$f_L = \frac{1}{2\Pi\sqrt{L_1 C_1}\left(-\frac{1}{2}\sqrt{\frac{C_2}{C_1}} + \sqrt{1 + \frac{1 C_2}{4 C_1}}\right)}, \text{ and}$$

$$f_H = \frac{1}{2\Pi\sqrt{L_1 C_1}\left(+\frac{1}{2}\sqrt{\frac{C_2}{C_1}} + \sqrt{1 + \frac{1 C_2}{4 C_1}}\right)}.$$

Next, given the circuit configuration for a specific passive filter, given the previously determined specifications for the electromagnetic device(s) of that specific passive filter, given the design rules for the technology node at issue (including but not limited to the critical dimensions specified for the different BEOL metal levels), given the selected basic crackstop configuration (e.g., a crackstop with a single metallic barrier; a crackstop with multiple concentric metallic barriers wherein the electromagnetic device(s) of each passive filter is to be integrated into the inner metallic barrier only; or a crackstop with multiple concentric metallic barriers where the electromagnetic device(s) of each passive filter are to be integrated into and/or between each of the metallic barriers), and given the locations aggressor device and victim device at issue within the IC area, the crackstop can be designed so that the electromagnetic device(s) for the specific passive filter are integrated therein, meet the required specifications, and are electrically connected in such a way (e.g., in parallel and/or in series) as to create the specific passive filter along a potential signal path between the aggressor device and the victim device.

The RFIC chip can subsequently be manufactured according to the updated design (see process step 1110). For example, multiple IC areas, each laterally surrounded by a crackstop, can be manufactured on a semiconductor wafer according to the updated design. The semiconductor wafer can then diced (i.e., cut up) into individual RFIC chips. Given the updated design, each manufactured RFIC chip can have a structure corresponding to the RFIC chip structure 300A (see FIGS. 3A and 8A-8E described in detail above), a structure corresponding to the RFIC chip structure 300B (see FIGS. 3B and 9A-9F described in detail above), or a structure corresponding to the RFIC chip structure 300C (see FIGS. 3C and 10A-10F described in detail above). That is, the manufactured RFIC chip 300A, 300B or 300C can include: a substrate 301; an integrated circuit (IC) area 310 on a center portion 302 of the substrate 301; and, on an edge portion 303 of the substrate 301 laterally surrounding and electrically isolated from the IC area 310, the crackstop 320 with the metallic barrier(s) (e.g., 325 in RFIC chip 300A or 325.1-325-2 in RFIC chip 300B or 300C) and, embedded in the metallic barrier(s), the passive filter(s) 390. In the manufactured RFIC chip, each passive filter 390 ensures that, when an RF signal in the specific RF range is emitted by a first device 311 (e.g., an RF device, also referred to herein as an aggressor device, which is at a first location within the IC area 310 near the perimeter) and couples with the crackstop 320, transmission of the RF signal through the crackstop 320 to a second device 312 (e.g., another RF device or a non-RF device, also referred to herein as a victim device, which is at a second location within the IC area 310 near the perimeter) is inhibited so as to prevent interference with operation of the second device 312.

The individual RFIC chips can subsequently be packaged or mounted directly onto a printed circuit boards (PCB).

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Aspects of the present invention may be implemented in a design system, method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus, or other device to produce a computer implemented process, such that the instructions which execute on the computer, other programmable apparatus, or other device implement the functions/acts specified in the flowchart and/or block diagram block or blocks.

The flowchart and block diagrams in the figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Figure 12:
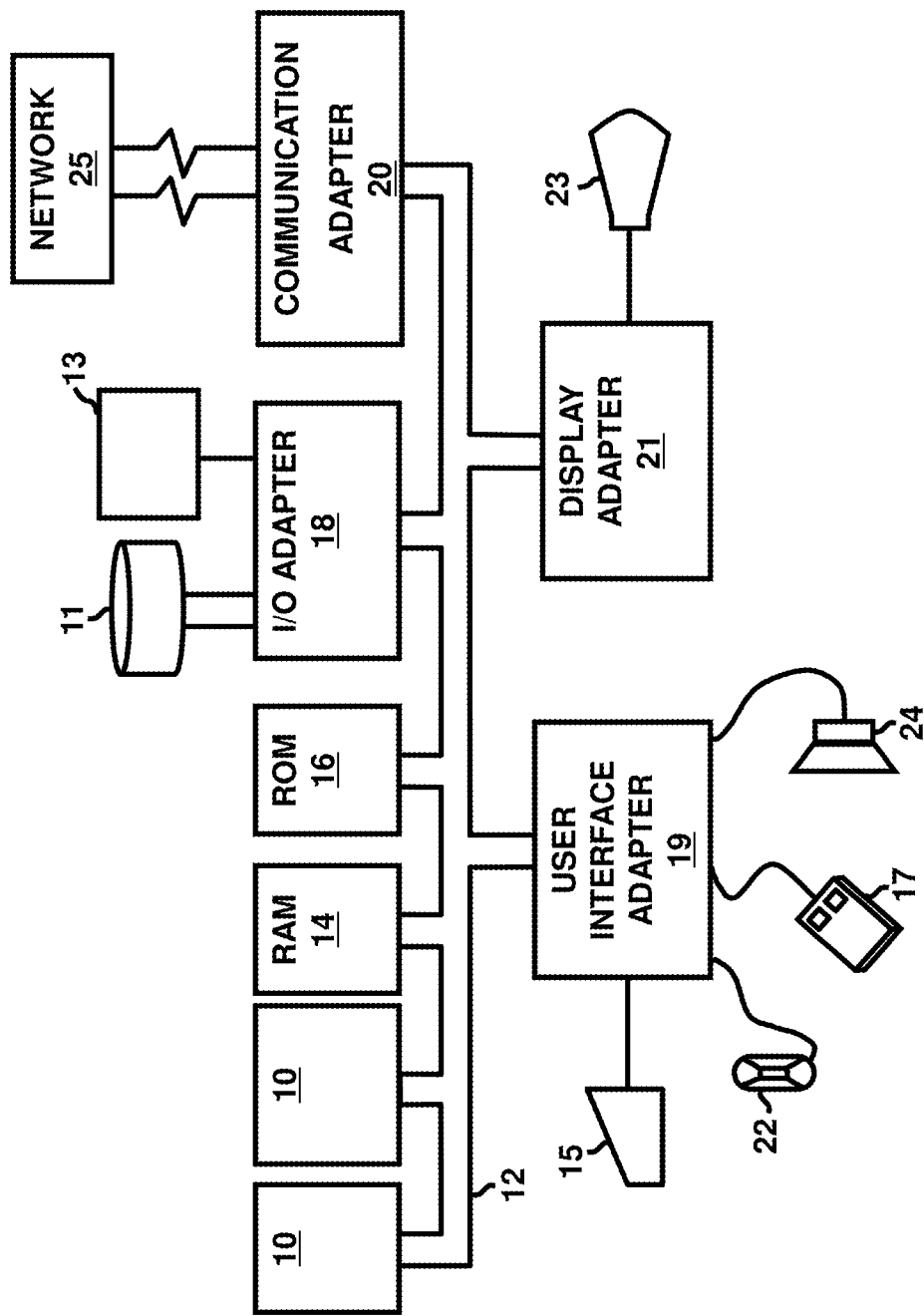
FIG. 12 is schematic diagram illustrating a representative hardware environment (i.e., a computer system) for implementing aspects of the disclosed design systems, methods, and computer program products.

A representative hardware environment (i.e., a computer system) for implementing aspects of the disclosed design systems, methods and computer program products is depicted in FIG. 12. This schematic drawing illustrates a hardware configuration of an information handling/computer system in accordance with the embodiments herein. The system comprises at least one processor or central processing unit (CPU) 10. The CPUs 10 are interconnected via a system bus 12 to various devices such as a random access memory (RAM) 14, read-only memory (ROM) 16, and an input/output (I/O) adapter 18. The I/O adapter 18 can connect to peripheral devices, such as disk units 11 and tape drives 13, or other program storage devices that are readable by the system. The system can read the inventive instructions on the program storage devices and follow these instructions to execute the methodology of the embodiments herein. The system further includes a user interface adapter 19 that connects a keyboard 15, mouse 17, speaker 24, microphone 22, and/or other user interface devices such as a touch screen device (not shown) to the bus 12 to gather user input. Additionally, a communication adapter 20 connects the bus 12 to a data processing network 25, and a display adapter 21 connects the bus 12 to a display device 23 which may be embodied as an output device such as a monitor, printer, or transmitter, for example.

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
   a substrate comprising a center portion and an edge portion;
   an integrated circuit area on the center portion; and
   multiple metallic barriers on the edge portion comprising:
      a first metallic barrier laterally surrounding and physically separated from the integrated circuit area;
      a second metallic barrier laterally surrounding the first metallic barrier; and
      a passive filter comprising at least one electromagnetic device, wherein the passive filter is any of embedded in the first metallic barrier, embedded in the second metallic barrier, embedded in both the first metallic barrier and the second metallic barrier, and embedded in a space between the first metallic barrier and the second metallic barrier and wherein the passive filter inhibits radio frequency noise signal propagation through the metallic barriers between different locations in the integrated circuit area,
   wherein the first metallic barrier is on a first well region in the substrate and the second metallic barrier is on a second well region in the substrate and having a different type conductivity than the first well region.

2. The structure of claim 1,
   wherein the integrated circuit area comprises radio frequency devices configured to operate within a specific radio frequency range,
   wherein the radio frequency noise signal propagation inhibited by the passive filter is within the specific radio frequency range, and
   wherein, when a radio frequency signal in the specific radio frequency range is emitted by a first device of the radio frequency devices at a first location within the integrated circuit area and couples with the first metallic barrier, the passive filter inhibits transmission of the radio frequency signal through any of the first metallic barrier and the second metallic barrier to prevent interference with operation of a second device of the radio frequency devices at a second location within the integrated circuit area.

3. The structure of claim 1,
   wherein the substrate comprises a semiconductor substrate comprising: a first well region with a first-type conductivity; and a second well region physically separated from the first well region and having a second-type conductivity,
   wherein an area of the substrate between the first well region and second well region has the first-type conductivity at a lower conductivity level than the first well region,
   wherein the first metallic barrier is on the area of the substrate between the first well region and the second well region, and
   wherein the second metallic barrier is on the second well region.

4. The structure of claim 1, wherein the passive filter is any of a low pass filter, a high pass filter, a band pass filter, and a band stop filter.

5. The structure of claim 1, wherein the at least one electromagnetic device comprises any of a resistor, a capacitor, an inductor, and a stub.

6. The structure of claim 1, wherein the second metallic barrier is electrically isolated from the first metallic barrier and the at least one electromagnetic device is integrated into the first metallic barrier.

7. The structure of claim 1, wherein at least the second metallic barrier is a continuous metallic barrier.

8. The structure of claim 7,
   wherein the at least one electromagnetic device comprises an inductor, and
   wherein the inductor is embedded in any of the first metallic barrier, the second metallic barrier, and a space between the first metallic barrier and the second metallic barrier.

9. The structure of claim 7,
   wherein the at least one electromagnetic device comprises a capacitor comprising: a first capacitor plate; a second capacitor plate; and a capacitor dielectric between the first capacitor plate and the second capacitor plate, and
   wherein the first capacitor plate and the second capacitor plate are embedded in any of the first metallic barrier and adjacent sections, respectively, of the first metallic barrier and the second metallic barrier.

* * * * *